(12) United States Patent
Tamba et al.

(10) Patent No.: US 6,661,659 B2
(45) Date of Patent: Dec. 9, 2003

(54) WATER COOLED INVERTER

(75) Inventors: Akihiro Tamba, Tokyo (JP); Takayoshi Nakamura, Tokyo (JP); Ryuichi Saito, Tokyo (JP); Naohiro Momma, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/100,012

(22) Filed: Mar. 19, 2002

(65) Prior Publication Data

US 2003/0067748 A1 Apr. 10, 2003

(30) Foreign Application Priority Data

Oct. 9, 2001 (JP) ........................................ 2001-311562

(51) Int. Cl.[7] ................................................ H05H 7/20
(52) U.S. Cl. ...................... 361/699; 165/80.4; 361/707; 361/719; 361/715; 363/141; 257/723
(58) Field of Search ............................... 165/80.2, 80.4; 174/15.1; 62/259.2; 257/706–707, 712–713, 723; 361/688–689, 699–703, 704–707, 710, 715; 363/141, 144–145, 147

(56) References Cited

U.S. PATENT DOCUMENTS 5,966,291 A * 10/1999 Baumel et al. ............. 361/707
6,166,937 A * 12/2000 Yamamura et al. ......... 363/141
6,414,867 B2 * 7/2002 Suzuki et al. ............... 363/141
6,529,394 B1 * 3/2003 Joseph et al. ............... 361/141

FOREIGN PATENT DOCUMENTS

| JP | 04002156 | 1/1992 |
| JP | 09121557 | 5/1997 |
| JP | 09207583 | 8/1997 |

* cited by examiner

*Primary Examiner*—Gregory Thompson
(74) *Attorney, Agent, or Firm*—Crowell & Moring LLP

(57) ABSTRACT

According to the invention, there is provided a water cooled inverter structure forming a plurality of shallow cavities and deep cavities in a housing, fixing a bottom surface of power semiconductor modules to shallow cavities to form a shallow water channel and directly cooling the power semiconductor modules using this shallow water channel. Since cooling water flows fast in the shallow water channel, it is possible to improve a cooling efficiency and also reduce pressure loss using a deep water channel with deep cavities. Furthermore, providing a plurality of cavities makes it possible to reduce a size of the power semiconductor modules and provide a plurality of power semiconductor modules, thus improving reliability. It is possible to place a control board below the water channel to thermally cut off the control board from the power semiconductor modules, which makes it possible to reduce temperature of a control circuit.

12 Claims, 25 Drawing Sheets

10: POWER MODULE
12: WATER CHANNEL
13: INVERTER HOUSING
14: TOP COVER
15: CONTROL CIRCUIT BOARD

WATER COOLED INVERTER

BACKGROUND OF THE INVENTION

1. Field of the Invention

The present invention relates to a water cooled inverter provided with a high heat generating power device such as an insulated gate bipolar transistor (hereinafter referred to as "IGBT").

2. Description of the Prior Art

An inverter for controlling a high output motor such as a motor for a hybrid electric vehicle generally has a structure as shown in sectional schematic diagrams of FIGS. 2, 23, 25 and 26. FIG. 23 shows a conventional example of an indirect cooling structure in which a power module is fixed to a water cooled heat sink via thermal conductive grease, and FIG. 2 shows a conventional example of a direct cooling structure in which cooling water directly contacts a base plate of a power module. FIGS. 25 and 26 show improved examples of the direct cooling structure.

In the indirect cooling structure shown in FIG. 23, a metal base plate 231 of a power module 230 is fixed to an inverter case 233 integrated with a cooling fin 235 via thermal conductive grease 232, which inverter case is made of metal such as aluminum die casting.

A water channel 236 is formed by attaching a water channel cover 234 so as to cover the lower part of the inverter case 233 with. A printed circuit board (hereinafter referred to as "PCB") 15 which is a control circuit board including circuit devices such as a microcontroller 16, a gate driver 17, a transformer 18 and an electrolytic capacitor 19 is placed above two power modules 230 which are placed side by side and is fixed to an inverter housing 233. A supply water channel and a drain channel to supply or drain the cooling water to/from the water channel 236 are placed at appropriate locations (not shown).

The PCB 15 is directly fixed to the inverter housing 233, but also may be attached to a support plate made of metal such as aluminum die casting and then fixed to the inverter housing 233. The upper surface of the inverter is covered with a metal cover 14.

The heat generated by a power semiconductor chip inside the power module 230 is transmitted through the base plate 231 and thermal conductive grease 232 to the fin 235, which is cooled with cooling water, and dissipated thereby. On the other hand, the heat of the circuit devices mounted on the PCB 15 is dissipated by natural convection and at the same time dissipated from through mounting section and the inverter housing 233, which inverter housing 233 is cooled with cooling water.

In the direct cooling structure shown in FIG. 2, as described in JP-A-9-207583, there are provided a water cooling opening 23 for a module in the inverter housing 21, and a metallic base 11 of a power module 10, which base is fixed to the inverter housing 21 so as to cover the opening 23.

A water channel 20 is formed by covering the bottom face of the inverter housing 21 with a water channel cover 22. In this structure, the cooling water directly contacts the metallic bases 11. By the way, the metallic base 11 is a flat plate, but may be provided with a fin. The other configurations including that of the control board are the same as those in FIG. 23, and the same reference numerals denote the same components.

The greatest advantage of the direct cooling structure over the indirect cooling structure in FIG. 23 is that it is possible to remove the grease 232 which has low thermal conductivity. This makes it possible to drastically reduce the thermal resistance from the junction of the power semiconductor chip to cooling water, namely Rth(j–w).

If thermal resistance can be reduced, it is possible to reduce a temperature amplitude ΔT due to repetition of heating and cooling of the power semiconductor chip during operation of the inverter. This reduces distortion in the interface between the aluminum wire and power semiconductor chip electrode and distortion in the solder, and thus improves the reliability, wire life and solder life.

Furthermore, FIG. 25 and FIG. 26 show the structure of a conventional example improved in performance in comparison with the direct cooling structure in FIG. 2, by two sections orthogonal to each other. In order to improve the heat dissipation efficiency by cooling water, that is, increase thermal conductivity "h", it is known to increase the flow velocity of the cooling water.

However, increasing the flow velocity causes an increase in the amount of cooling water, which increases the burden on the pump circulating the cooling water. As a result, the pump capacity needs to be increased.

This leads to an increase in size of the pump, which is fatal if there are strict restrictions on the installation space and weight as in the case of an electric vehicle. Thus, it is preferable to minimize the increase in the amount of cooling water while increasing the flow velocity. This conventional example addresses this problem.

In the water channel structure 250 having an opening 252 where the power module 10 is mounted, a convex section 251 is fixed and a shallow water channel area 254 is provided in the water channel 253. Since the convex section 251 is provided only under the power module 10, a high flow velocity section only exists locally under the power module 10 and thereby can prevent an increase of pressure loss. An example similar to this conventional example is described in JP-A-4-2156, etc.

BRIEF SUMMARY OF THE INVENTION

However, the conventional example shown in FIGS. 25 and 26, in which the increase of the flow velocity of cooling water is taken into account, has the following problems in the aspects of the system configuration and the cooling performance.

The depth 256 of the shallow water channel which implements high flow velocity is finally restricted by the thickness 257 of the water channel structure 250. When taking the processing accuracy of components into account, it is practically difficult to allow the convex section 251 to extend into the opening 252.

It is difficult to reduce the thickness 257 to, for example, 1 to 2 mm from the standpoint of its strength. This becomes more conspicuous in the case of an inverter having a large shape such as a high capacity inverter. Therefore, the conventional structure does not allow the flow velocity to be increased drastically while suppressing the increase of the flow rate.

Furthermore, when the height of the convex section 251 is small, the flow velocity in the area on the power module base plate 11 side in the shallow water channel area 254 is lower than that in the area on the water channel structure 250 side, and therefore the cooling water becomes easily stagnant to prevent efficient heat dissipation and to increase the temperature of the cooling water.

This adversely affects the effect of providing the convex section 251. Moreover, when the water channel structure 250 has a one-body structure as shown in FIGS. 25 and 26, the shape of the convex section 251 shown in FIG. 26 can hardly be realized in a practical sense.

When consideration is given to inserting the convex section 251 from the opening 252 and fixing there, the convex section 251 must be smaller than the opening 252. Therefore, it is impossible to significantly increase the flow velocity in the shallow water channel area 254.

Furthermore, in the case of the above-described conventional example, no consideration is given to mounting a plurality of power modules. In the case of a large capacity inverter, it is hardly imaginable to construct a system only with a single power module. This is because there is a limit to increasing the size of the module when inner stress and yield of the power module are taken into account.

In the above, heat dissipation of the power module 10 is considered. However, in the case of an apparatus such as an inverter in which a high heat generating power module and a control circuit exist, it is also important to reduce the temperature of the control circuit.

In the above-described conventional example, heat dissipation of the power module is considered, but heat dissipation of the control circuit is not considered. In this condition, even if high reliability is realized by providing high heat dissipation for only the power module, the reliability as the apparatus per se is impaired.

It is an object of the present invention to provide an inverter structure capable of increasing the flow velocity possibly while suppressing an increase in the amount of cooling water, suppressing an increase of pressure loss and therefore improving the reliability of the power module, and further to provide an inverter structure capable of significantly reducing the temperature of the control circuit in the inverter.

Main subjects of the present invention will be explained by using FIGS. 1, 4 and 24 below.

FIG. 1 is a schematic diagram of a sectional structure of a mounting area of power modules 10 which constitute an inverter. The inverter housing 13 houses two power modules 10 placed side by side and a control circuit board 15. The inverter housing 13 is covered with a top cover 14. The control circuit board 15 is provided with circuit devices such as a microcontroller 16, a gate driver 17, a transformer 18 and an electrolytic capacitor 19.

In the case where thermal conductivity is high as in the case of high flow velocity cooling, the heat transfer area need not be increased. For example, it is sufficient to provide an area about 10 times as large as the chip area of the power semiconductor generating the heat. More specifically, when the chip size is approximately 10 mm per side, a heat transfer area of about 33 mm per side is sufficient in a practical sense.

In this case, there is no longer necessity for providing a fin for the heat transfer section as in the case of the conventional examples in FIGS. 2, 25 and 26. The point is how easily and accurately a shallow water channel is formed to increase the flow velocity without increasing the flow rate.

In the present invention, by forming a shallow cavity in the inverter housing 13 and covering this cavity with the metallic bases 11 of the power modules 10, the shallow water channels 12 is formed. Water supply/drain channels 121 and 122 to supply/drain cooling water to/from the water channels 12 are provided at appropriate locations. The supply/drain channels 121 and 122 are schematically shown. The inverter housing 13 is manufactured using techniques such as press working on an aluminum plate or aluminum die casting, and therefore it is easy to accurately form a shallow cavity of, for example, 1 to 2 mm in depth.

On the other hand, a demerit of such shallow water channels 12 is that pressure loss increases because of the small cross sectional areas of the water channels. This problem is treated as follows.

As described above, in the case of cooling at high flow velocity, the heat transfer area need not be a large area, and therefore it is possible to locally place the shallow water channels 12 below the power module 10. Therefore, to reduce pressure loss, the cross-sectional area of the part of the water channel, which is not directly related to heat dissipation of the power module 10, is increased wherever possible.

FIG. 24 shows a schematic diagram of a section of this part. Unlike FIG. 1, a deep cavity is formed in the inverter housing 13 and deep water channels 240 are formed. There is no power module 10 above these water channels.

As described above, according to the present invention, a cooling water channel is constructed by forming cavities of different depths in the inverter housing 13 and by connecting these cavities. The cooling is performed in a shallow water channel formed using a shallow cavity, so that it is possible to cool with high efficiency without increasing the flow rate or pressure loss. Moreover, by placing a plurality of power modules above a plurality of shallow cavities, the present invention can also easily incorporate a plurality of power modules.

In the above-described explanations, the shallow cavities are provided on the inverter housing 13 side. On the other hand, it is also possible to provide shallow cavities on the metallic base 11 side to construct the cooling water channels 125 as shown by dotted line, or it is further possible to provide shallow cavities for both the inverter housing 13 and metallic bases 11.

Then, low temperature implementation of the control circuit will be explained using FIG. 4.

FIG. 4 shows a schematic diagram of a sectional structure of the mounting section of power modules 10. An inverter housing 42 houses two power modules 10 and a driver circuit board 40 and is covered with a top cover 14. Apart from the driver board 40, a microcontroller board 41 is housed in a bottom cover 43 located on the bottom face of the inverter housing 42. As in the above-described case, shallow water channels 12 are formed in shallow cavities in the inverter housing 42.

In this structure, the microcontroller board 41 on which microcontrollers 16, heat-sensitive parts, are mounted is thermally cut off from the inverter housing 42 on which the power modules 10 as high heating parts exist, and therefore the temperature of the microcontroller board never increases drastically.

Furthermore, while the power semiconductor modules 10 need to be placed close to the driver board 40, a relatively large distance between the microcontroller board 41 and driver board 40 causes no noise-related problem.

The features of the present invention are described above, however, features other than those described above will become more apparent from the following descriptions of preferred embodiments of the invention.

Other objects, features and advantages of the invention will become apparent from the following description of the embodiments of the invention taken in conjunction with the accompanying drawings.

DETAILED DESCRIPTION OF THE INVENTION (Embodiment 1)

Figure 6:
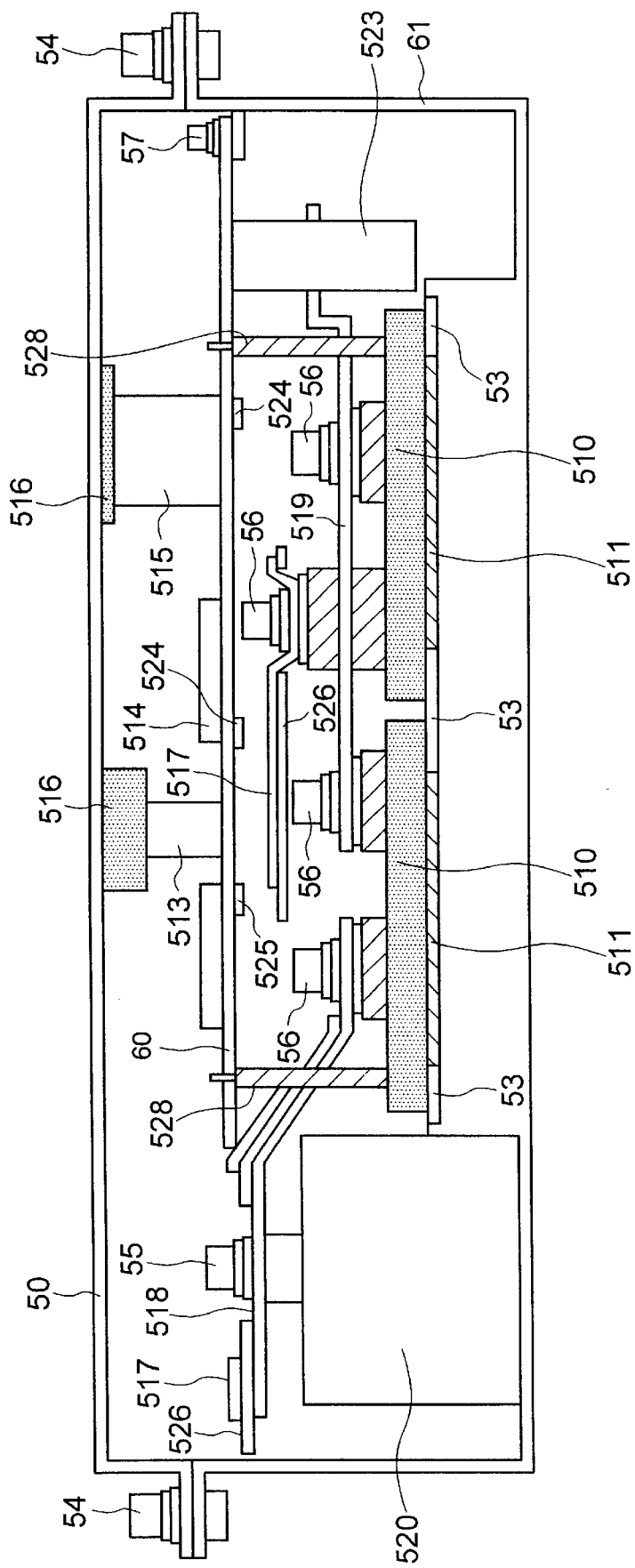
FIG. 6 is a schematic diagram of a sectional structure according to a first embodiment.

FIG. 6 is a schematic diagram of a sectional structure according to a first embodiment of the present invention and shows a schematic diagram of a sectional structure of a power module mounting section. It is an example of a 35 kW 3-phase inverter incorporating an IGBT module with a rated voltage and current of 600 V and 400 A. An aluminum die cast inverter housing 61 houses a control circuit board 60 provided with six 1-arm IGBT modules 510, an electrolytic capacitor 513, a transformer 515, a microcontroller 512, an IGBT gate driver 514, a chip resistor 524 and a chip capacitor 525, and two electrolytic capacitors 513 which are filter capacitors, etc. and is covered with a top cover 50.

The top cover 50 and the inverter housing 61 are connected with M6 bolts 54 using a gasket (not shown). To reduce radiation noise, a metallic gasket is used. Approximate dimensions of the inverter housing 61 are 230 mm (W)×260 mm (L)×60 mm (H) (including the top cover) and when its capacity of 35 kW is considered, the inverter housing 61 is a small-sized inverter.

Dimensions of the filter capacitor are 40 mmφ and 30 mm high. Approximate dimensions of the IGBT module 510 are 70 mm×60 mm and two IGBT chips and two free wheeling diodes (FWD) chips are incorporated. U, V and W output wires 519, P bus bar 518, N bus bar 517 and a control circuit board 60 are connected to the IGBT module 510.

The bus bars are made of tough pitch copper and 1.5 mm thick. Power wires are fixed with M5 bolts 56. The P bus bar 518 and N bus bar 517 are fixed via an insulation sheet 526 such as resin and have a structure to reduce mutual inductance. The control circuit board is adhered to a control terminal 528 of the IGBT module 510 by means of through hole solder.

The control circuit board is fixed to the periphery of the inverter housing 61 with M3 bolts 57. The filter capacitor 520 is connected to the P and N terminal sides of the P bus bar 518 and N bus bar 517 with an M5 bolt 55.

In this schematic diagram of the sectional structure, the U, V, P and N terminals of the inverter, the control terminal and the water supply/drain pipes are omitted. The P and N terminals are actually placed at the left end and the U, V and W terminals are placed at the right end in the figure. Furthermore, a current transformer 523 which is a current detector for control is connected to the U, V and W wires 519. The minimum thickness of the aluminum die cast inverter housing 61 is 2 mm and designed to have the lightest possible weight. The thickness of the top cover is 2 mm.

The depth of the shallow water channel 511 which is a characteristic of the present invention is 2 mm. In this embodiment, a cavity of 2 mm in depth is formed by pasting an aluminum plate 53 of 2 mm in thickness with an opening to the inverter housing 61. The peripheries of the inverter housing 61 and aluminum plate 53 are welded to prevent water leakage.

Furthermore, a liquid gasket (not shown) is used to fix the IGBT module 510 to prevent water leakage. The area where no IGBT module is mounted constitutes a deep water channel which is formed of a cavity as deep as 15 mm on the bottom face 62 of the housing. Heat dissipation of the filter capacitor 520 is realized with the bottom face of the capacitor adhered to the inverter housing 61. The electrolytic capacitor 513 and transformer 515 in the control circuit are parts especially vulnerable to heat.

Therefore, this embodiment places thermal conductive sheets 516 on the top face of the electrolytic capacitor 513 and transformer 515 to contact the top cover 50 to dissipate heat toward the top cover and toward the inverter housing 61 and water channel 511 via the top cover.

While pouring cooling water (main component: ethylene glycol) at 15 l/min into the cooling water channel of this structure, thermal resistance (from the chip junction to cooling water, Rth(j–w)) and pressure loss of the IGBT module were measured. The measurement result shows that Rth(j–w) is 0.1 K/W per arm and pressure loss is 15 kPa in the entire inverter.

The pressure loss is normally equivalent to that of an inverter apparatus with this type of capacity and thermal resistance could be reduced to half or less than conventional indirect cooling. The temperature of the microcontroller 512 during operation with rated load is approximately 100° C. and the above-described measure allowed the temperatures of the electrolytic capacitor 513 and transformer 515 to be set to as low as 80° C. and 90° C., respectively. Furthermore, it was possible to confirm that sealing performance of cooling water at the interface between the IGBT module 510 and housing 61 was 200 kPa or more.

(Embodiment 2)

Figure 7:
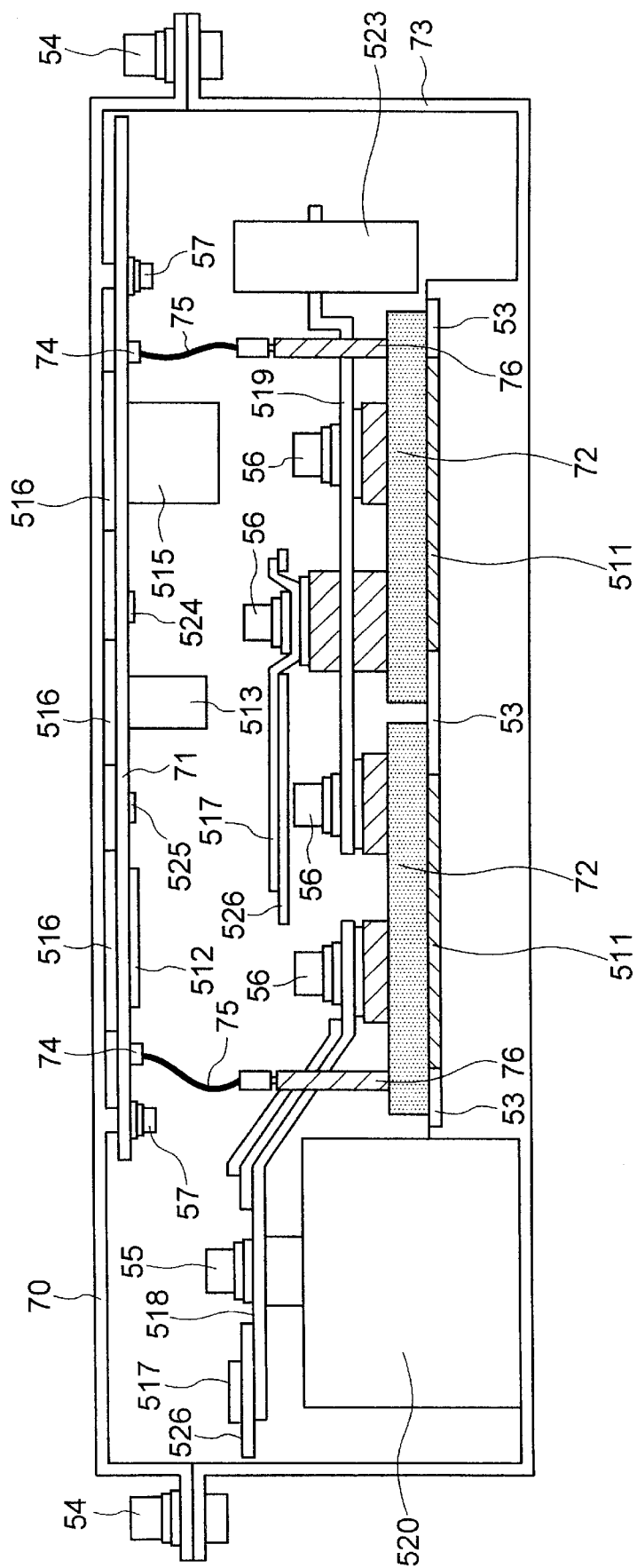
FIG. 7 is a schematic diagram of a sectional structure according to a second embodiment.

FIG. 7 illustrates a second embodiment of the present invention and shows a schematic diagram of a sectional structure of a power module mounting section as in the case of the first embodiment. It is different from the first embodiment in the functions, structure of the IGBT module 72 and control circuit board 71 and the methods of connecting and fixing them.

In FIG. 6, the control circuit board 60 is fixed to the inverter housing 61 in its periphery wherever possible. However, as in the case of an electric vehicle inverter which is used in a severe vibration environment, there remains concern about mechanical deterioration due to resonance, etc.

This embodiment addresses this problem and a control circuit board 71 is fixed firmly to a top cover 70 with M3 bolts 57, having a structure extremely resistant to vibration. Furthermore, heat dissipation for a microcontroller 512, an electrolytic capacitor 513 and a transformer 516 is realized by fixing thermal conductive sheets 516 between the back of the printed circuit board (PCB) on which these parts are mounted and the top cover as in the case of the first embodiment.

Using this structure increases the distance between the IGBT modules 72 and the control circuit board 71. That is, when a gate driver is placed on the control board, the distance between the gate driver and the IGBT modules increases, which makes this structure vulnerable to noise.

Thus, this embodiment adopts IGBT modules incorporating a gate driver as the IGBT modules 72 and uses a gate driver control signal as the control signal to the modules 72.

Conventionally, it has been apparent that even if this signal wire is relatively long, there is no problem with noise. This control signal is sent/received between the interface terminal 74 and the control terminal 76 of the IGBT modules 72 incorporating the gate driver via interface cables 75.

With respect to the cooling performance, the IGBT modules 72 incorporating the gate driver are equivalent to Embodiment 1, and since heat is dissipated efficiently from the control circuit board 71 through the top cover, its temperature could be reduced about 5° C. compared to the first embodiment.

(Embodiment 3)

The above-described two embodiments describe the case basically using one control circuit board where it is possible to reduce the number of parts, reduce the size of the control circuit board, and therefore there are advantages of being able to reduce assembling man hours and reduce the size of the inverter.

However, reduction of yield of the control circuit board itself and coexistence of the control circuit board and the IGBT modules in the same space cause a high temperature environment, which prevents use of low temperature specification, low price microcontrollers.

Therefore, if it is possible to suppress an expansion of the inverter dimensions, it is preferable to divide the control circuit board into two portions, for example, a driver board and a microcontroller board. A third embodiment realizes this.

Figure 5:
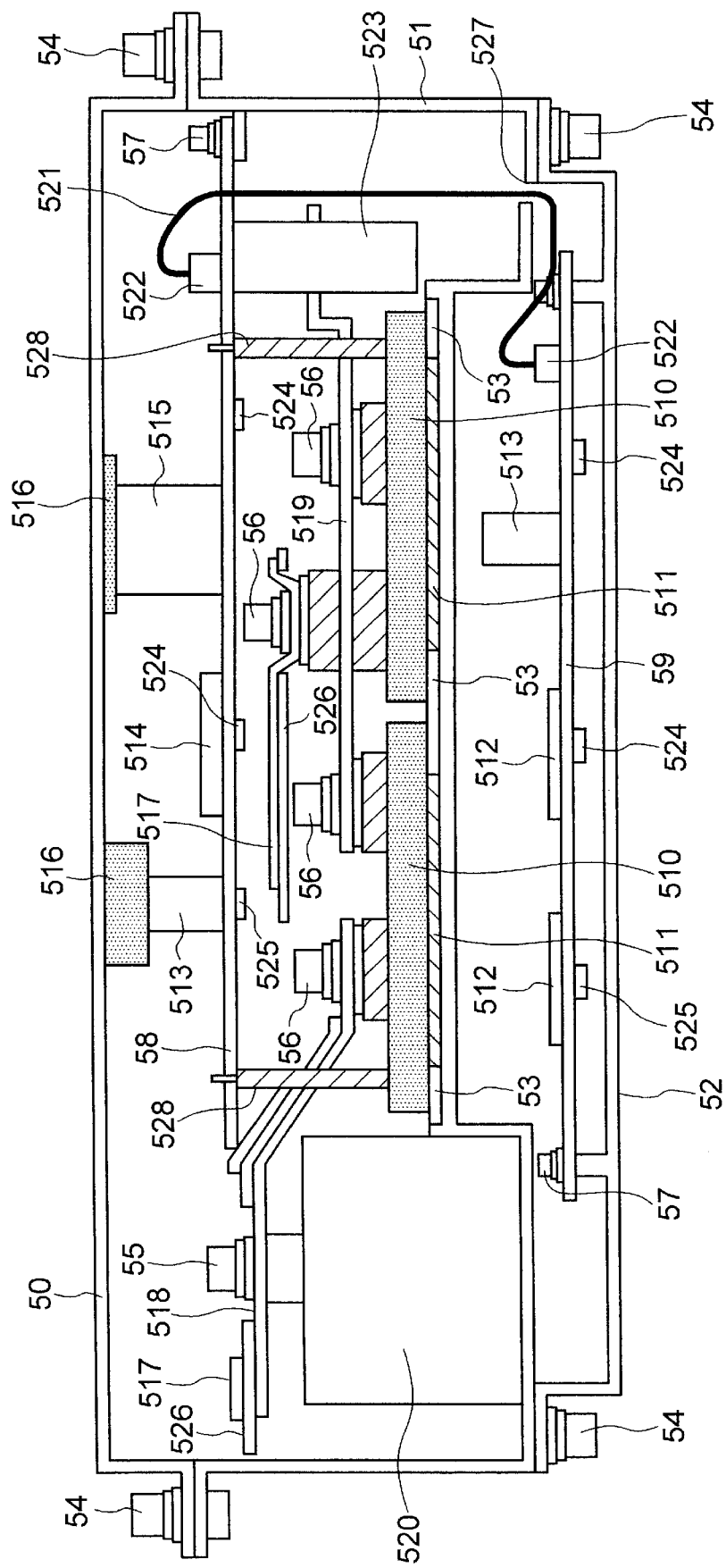
FIG. 5 is a schematic diagram of a sectional structure according to a third embodiment.

FIG. 5 is a schematic diagram of a sectional structure of the mounting section of the IGBT modules 510. IGBT modules 510, filter capacitors 520 and their power wires are the same as those in Embodiment 1. The cooling structure for the IGBT modules 510 and filter capacitors 520 is also basically the same as that of Embodiment 1.

The above-described control circuit board is divided into a first control circuit board (driver board) 58 provided with a gate driver 514, an electrolytic capacitor 513 and a transformer 515, etc. having a gate drive and control power supply functions and a second control circuit board (microcontroller board) 59 having the function of controlling the first control board provided with microcontrollers 512 and an electrolytic capacitor 513, etc.

The method of connecting or fixing the driver board 58 to the IGBT modules 510 and the heat dissipation method are the same as those in Embodiment 1. This embodiment features the method of mounting the microcontroller board 59. An aluminum die cast bottom cover 52 of 2 mm in thickness is newly provided and the microcontroller board 59 is fixed to this bottom cover with M3 bolts 57.

The bottom cover is fixed to the housing 51 with an M6 bolt 54 inserted into a screw hole perforated in the bottom face of the inverter housing 51. Connection with the driver board 58 is realized with an interface cable 521 passing through an area created by an opening 527 on part of the bottom surface of the housing 51. The terminal 522 is an interface terminal.

Signals exchanged via the interface cable 521 are insulated by a photocoupler. As described above, signals between the microcontroller and gate driver are resistant to noise, and therefore even an interface cable of approximately 8 cm has no noise-related problem.

Furthermore, the microcontrollers 512 are located on the lower surface of the cooling water channel 511 and thermally cut off from the IGBT modules 510, and therefore it is possible to reduce its temperature down to 85° C. without using any special heat dissipating means and use a microcontroller with thermal resistance one rank lower. The height of the inverter increases by an amount corresponding to the expansion of the bottom cover, and its dimensions are approximately 230 mm (W)×260 mm (L)×70 mm (H) (including the top cover and bottom cover).

Then, a top-viewed structure of this embodiment will be explained using FIGS. 17 to 22. FIGS. 17 to 22 are schematic diagrams of the top-viewed structure excluding the top cover, bottom cover including the microcontroller board, driver board and the interface section of the microcontroller board (FIGS. 17 and 18 include sectional schematic diagrams).

Figure 17:
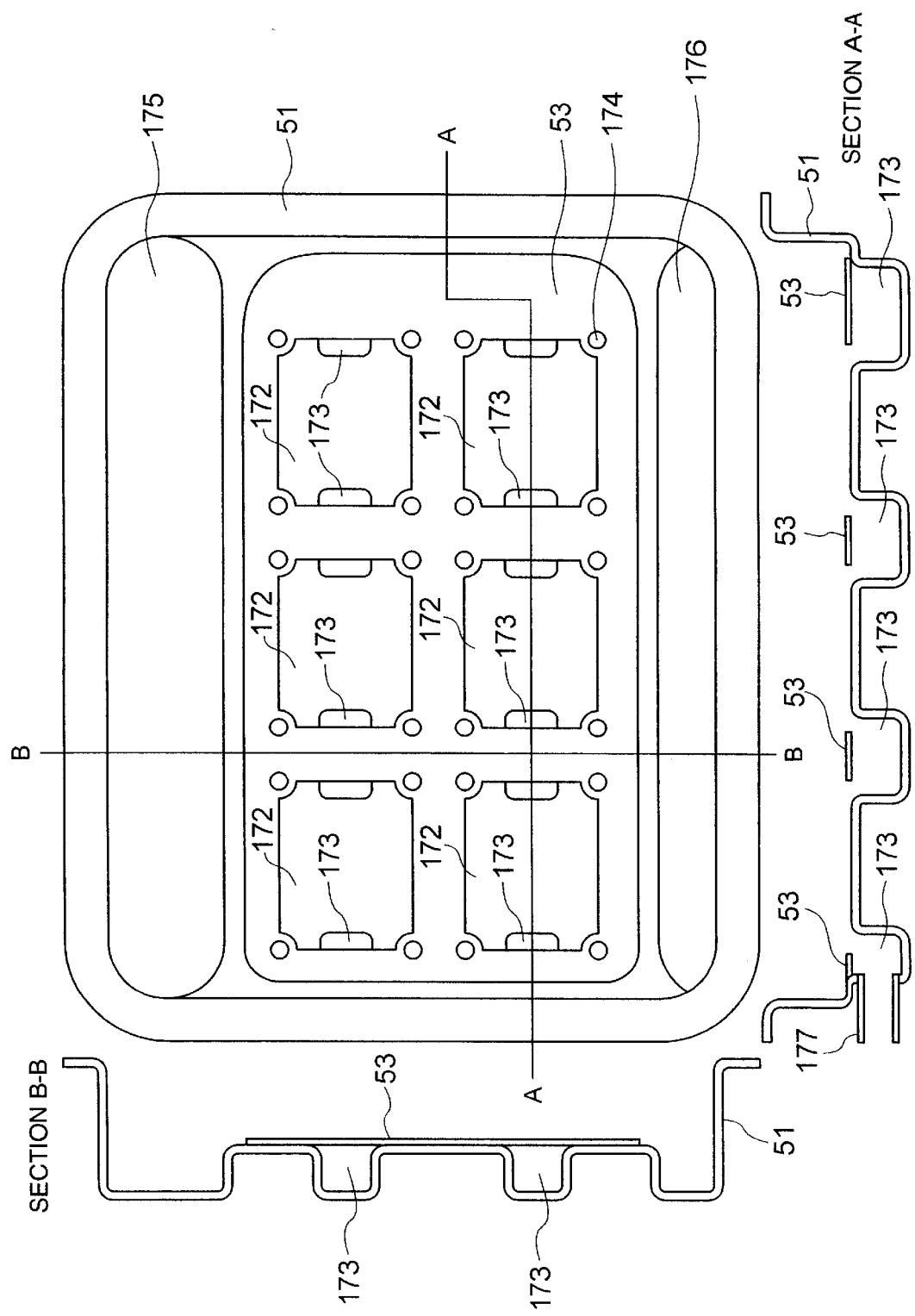
FIG. 17 is a schematic diagram of a top view and a sectional view showing a water channel structure of an embodiment.

FIG. 17 is a top view and sectional view before mounting the IGBT modules 510. An aluminum plate (plate thickness: 2 mm) 53 provided with openings 172 and M5 screw holes 174 is fixed to the aluminum die cast housing 51 in which a cavity 175 for mounting a filter capacitor 520, etc. and a cavity 176 for mounting a current transformer 523, etc. are formed.

Figure 18:
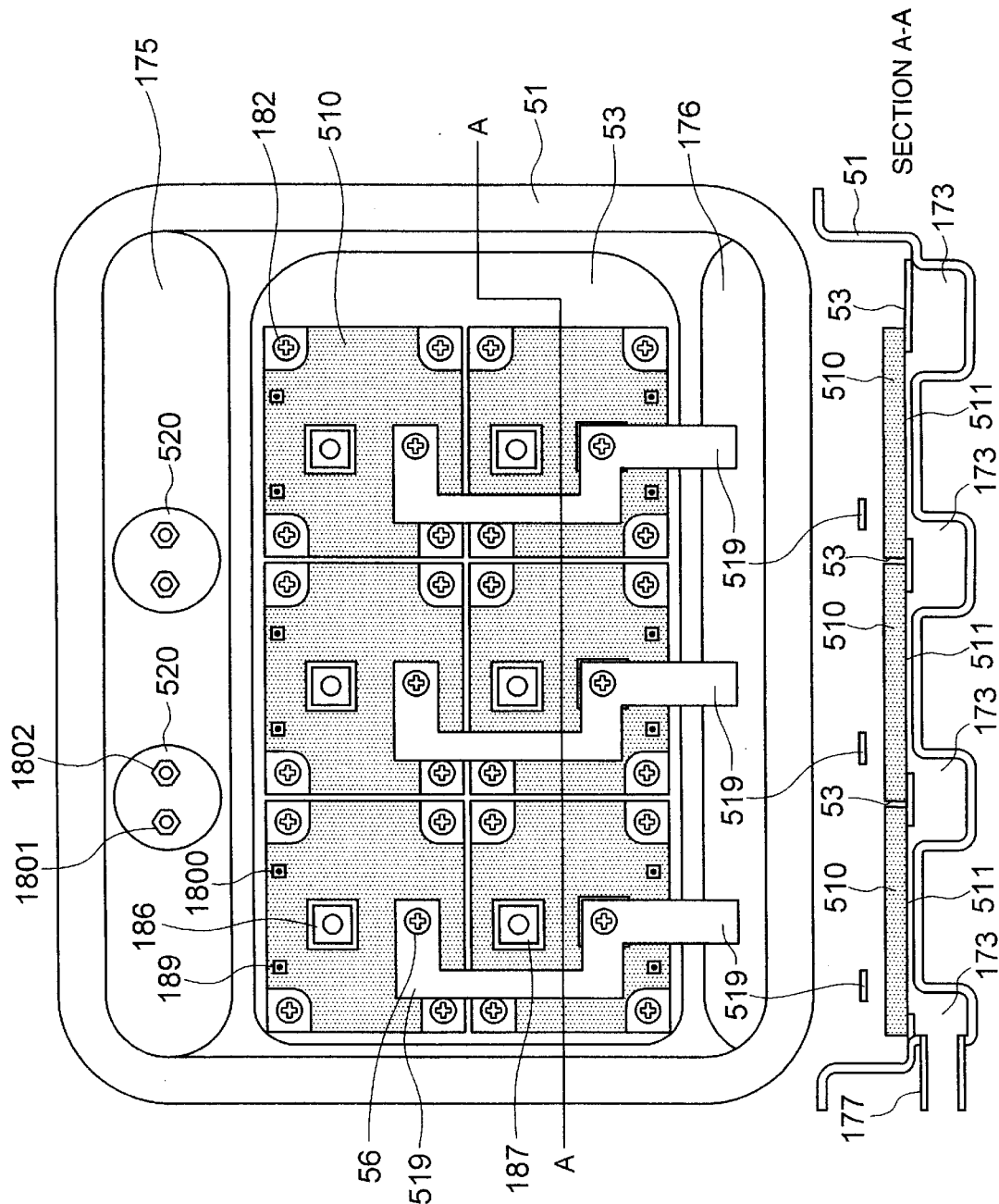
FIG. 18 is a schematic diagram of a top view and a sectional view of an embodiment showing power modules mounted.

The aluminum plate 53 is fixed by welding the periphery of the aluminum plate 53 to the housing 51. This structure forms deep water channels 173 to reduce pressure loss. The water supply/drain pipe has an inner diameter of 5 mmφ and is provided on one side (at the left end in the figure) of the inverter. FIG. 18 shows a top view and a sectional view after the IGBT modules 510, filter capacitors 520 and U, V and W wires 519 are mounted.

The IGBT modules 510 are attached to the housing 51 (aluminum plate 53) with M5 bolts 182 through liquid gaskets and the filter capacitors 520 are adhered to an area 175. The U, V and W wires 519 are attached to main terminals of the IGBT modules 510 with M5 bolts 56.

Terminals 186, 187, 189 and 1800 are a P terminal, N terminal, auxiliary emitter terminal and gate terminal, respectively. Terminals 1801 and 1802 of the filter capacitor 520 are an anode and cathode terminals, respectively. The inclusion of the IGBT modules 510 forms shallow water channels of 2 mm in depth.

Figure 19:
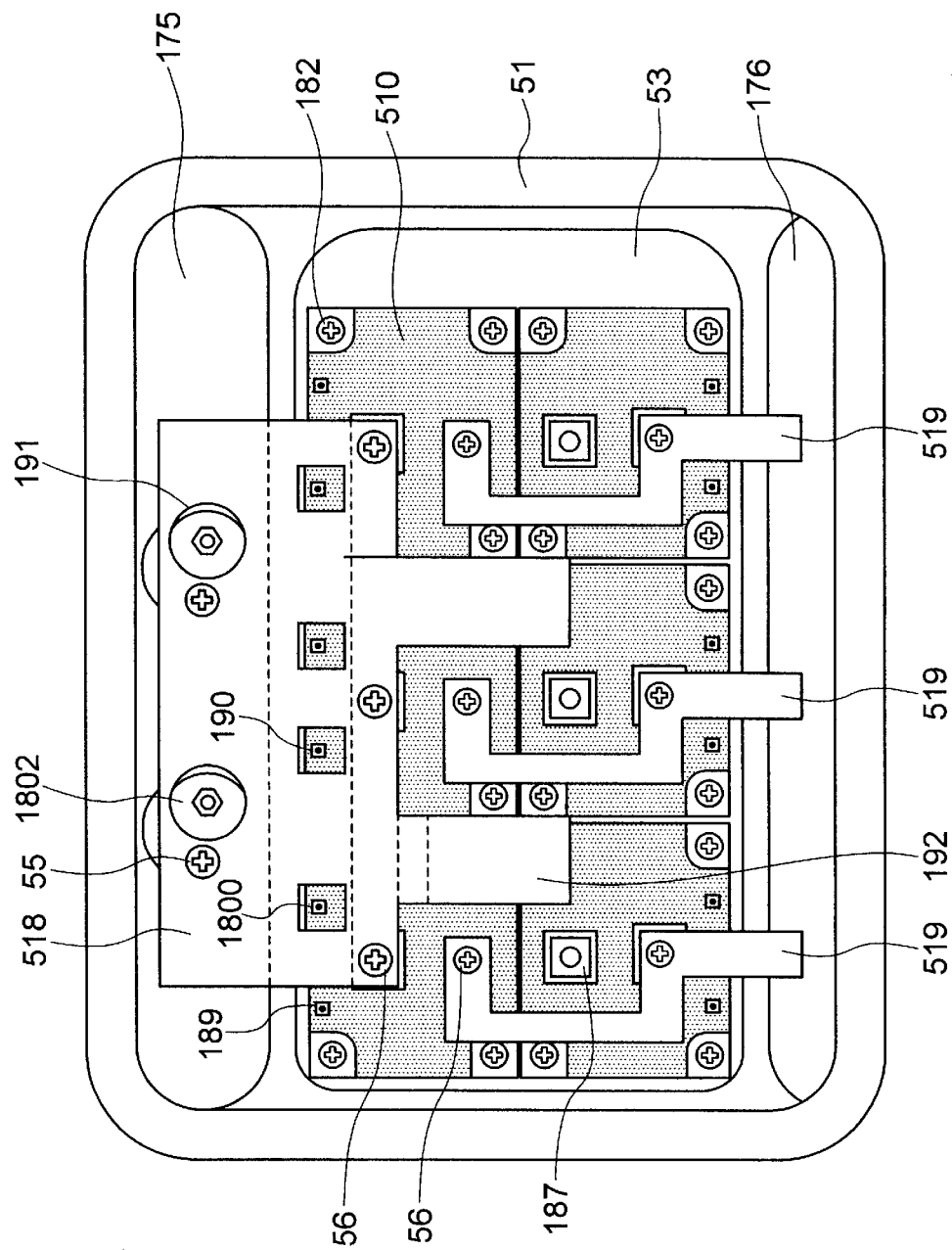
FIG. 19 is a schematic diagram of a top view of an embodiment showing a P bus bar mounted.

FIG. 19 is a schematic diagram showing a top view after a P bus bar 518 is mounted. The P bus bar 518 made of tough pitch copper of 1.5 mm in thickness is provided with an opening 190 to pass the gate terminal 1800 and the auxiliary emitter terminal 189 and an opening 191 to attach a filter capacitor cathode 1802, and the P bus bar 518 is attached to the aforementioned P terminal 186 and the aforementioned anode 1801 with M5 bolts 56 and 55.

Figure 20:
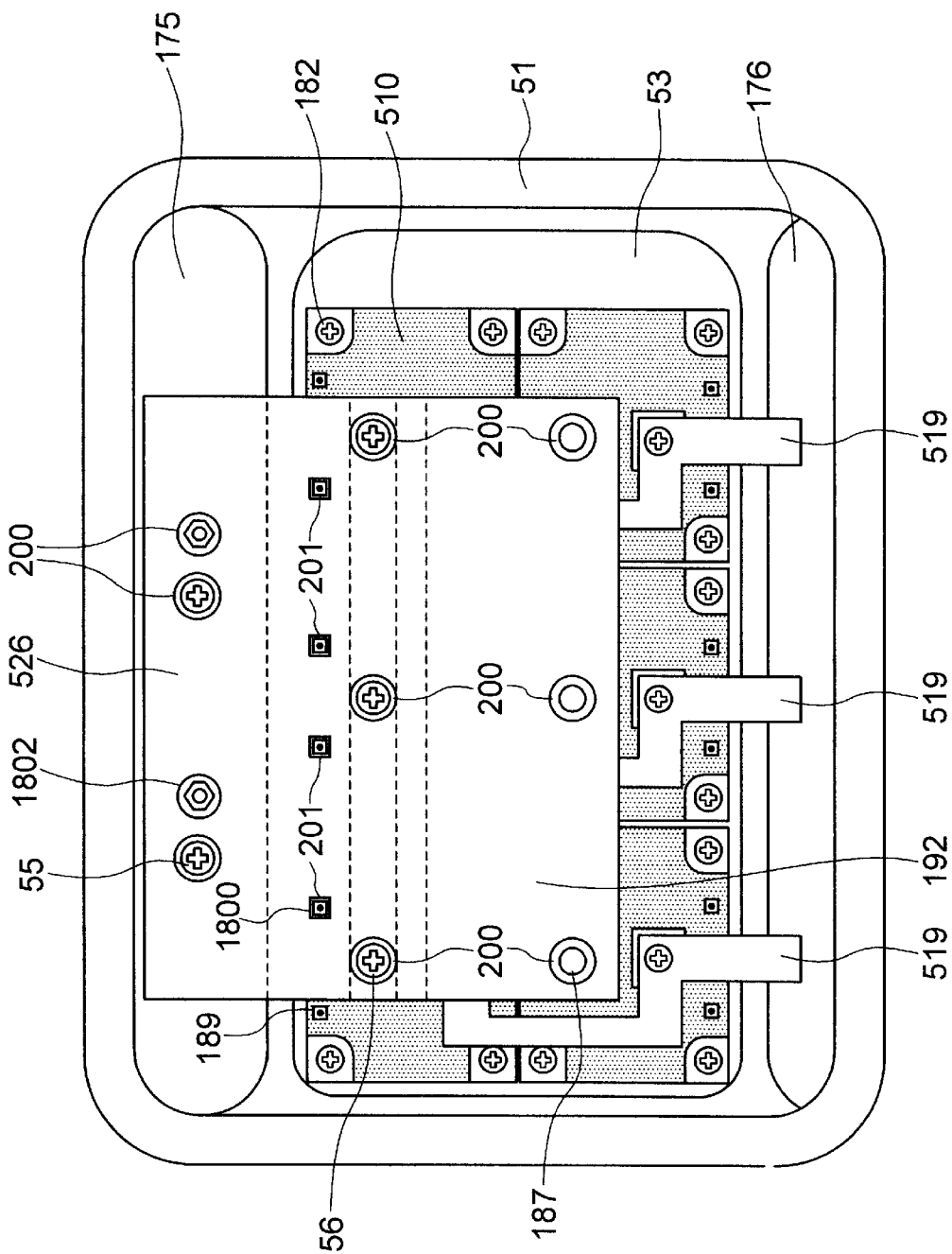
FIG. 20 is a schematic diagram of a top view of an embodiment showing P and N bus bar insulating boards mounted.

The part 192 that extends from the P terminal 186 is an area to reduce inductance of the N terminal fixed on top thereof. FIG. 20 is a top view after an insulating plate 526 for insulating the P and N bus bars 518 and 517 is mounted. The insulating plate 526 of 1 mm in thickness is provided with openings 200 for the IGBT module 510 main terminal and the filter capacitor terminal, and an opening 201 for the IGBT module 510 control terminal, and is attached to the entire surface of the aforementioned P bus bar 518.

Figure 21:
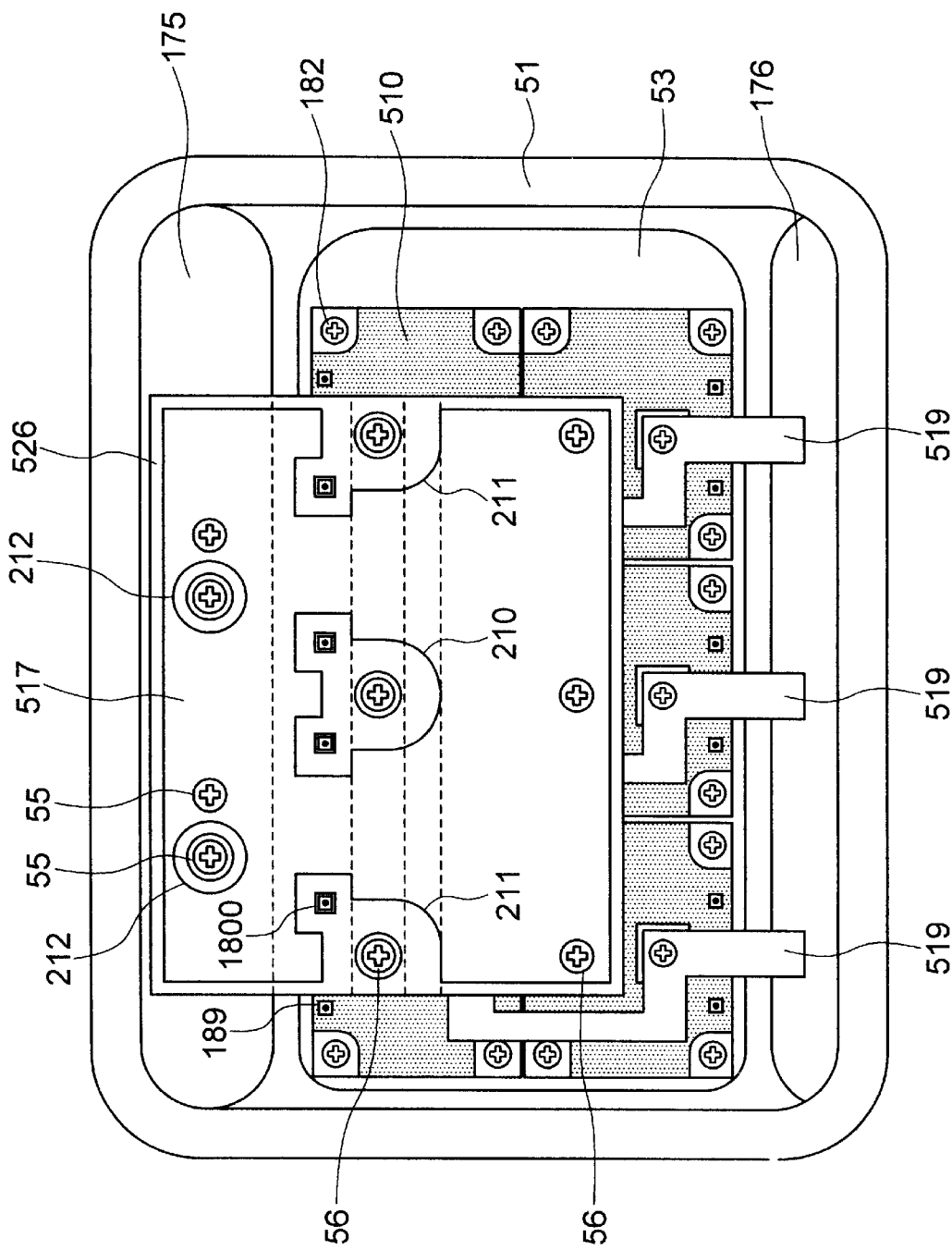
FIG. 21 is a schematic diagram of a top view of an embodiment showing an N bus bar mounted.

FIG. 21 is a top view after the N bus bar 517 is mounted. Like the P bus bar 518, the N bus bar 517 made of tough pitch copper of 1.5 mm in thickness is provided with openings 212 for the filter capacitor anode, the IGBT module 510 control terminal and a main terminal opening 210 and notches 211, and is pasted to the aforementioned insulting plate 526 and connected to the filter capacitor cathode 1802 and the N terminal 187 of the IGBT module 510 with M5 bolts 55 and 56. The shape of the openings and notches is designed to make the width of the bus bar as large as possible to reduce inductance.

Figure 22:
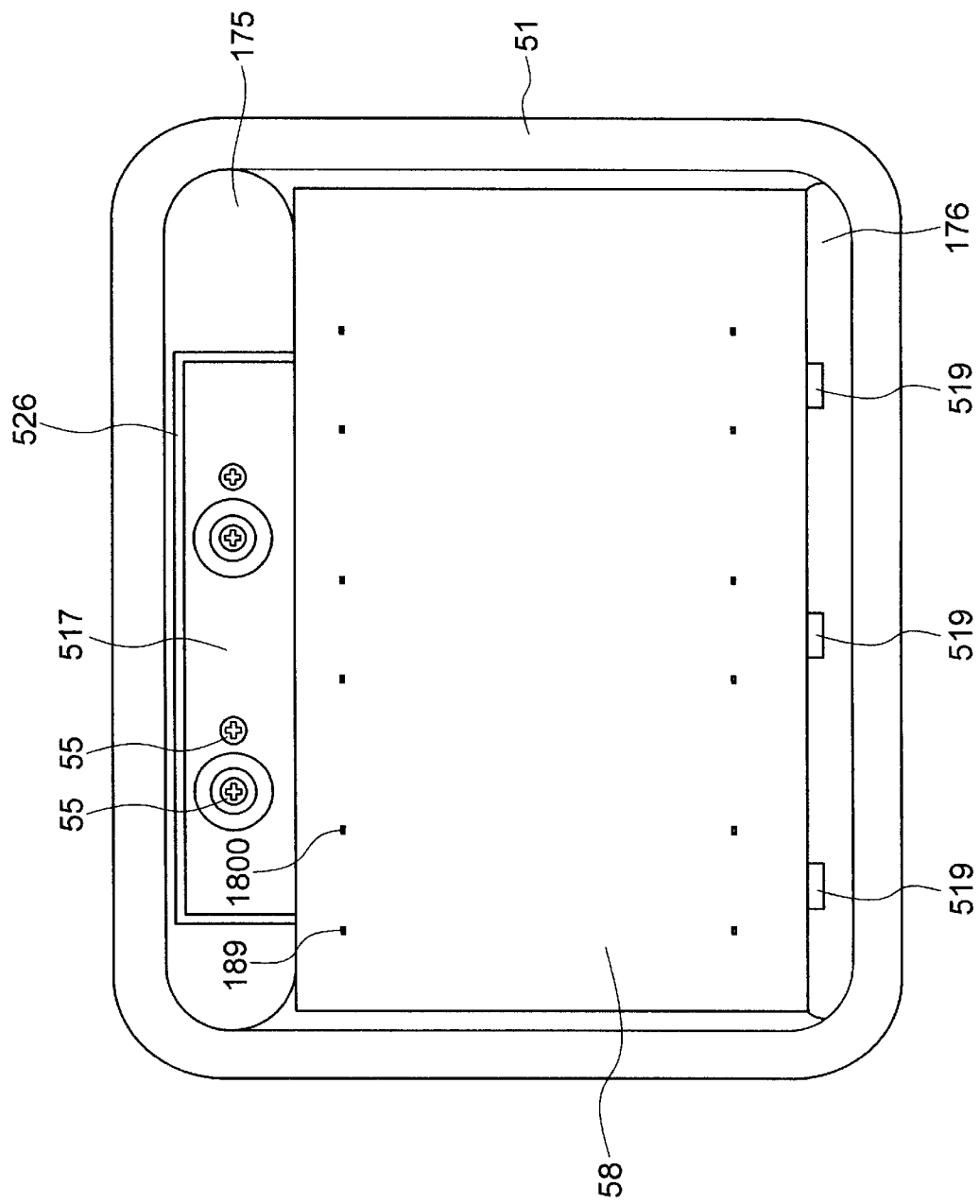
FIG. 22 is a schematic diagram of a top view of an embodiment showing a control circuit board mounted.
Figure 23:
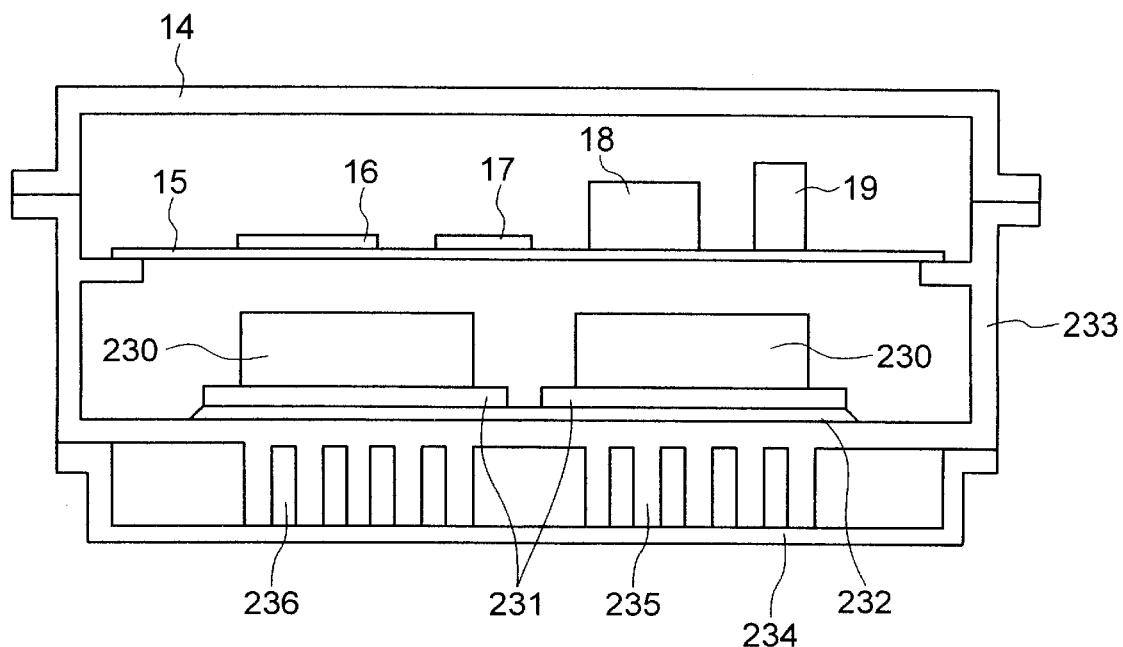
FIG. 23 is a schematic diagram of a section showing an inverter with a conventional indirect cooling structure.
Figure 24:
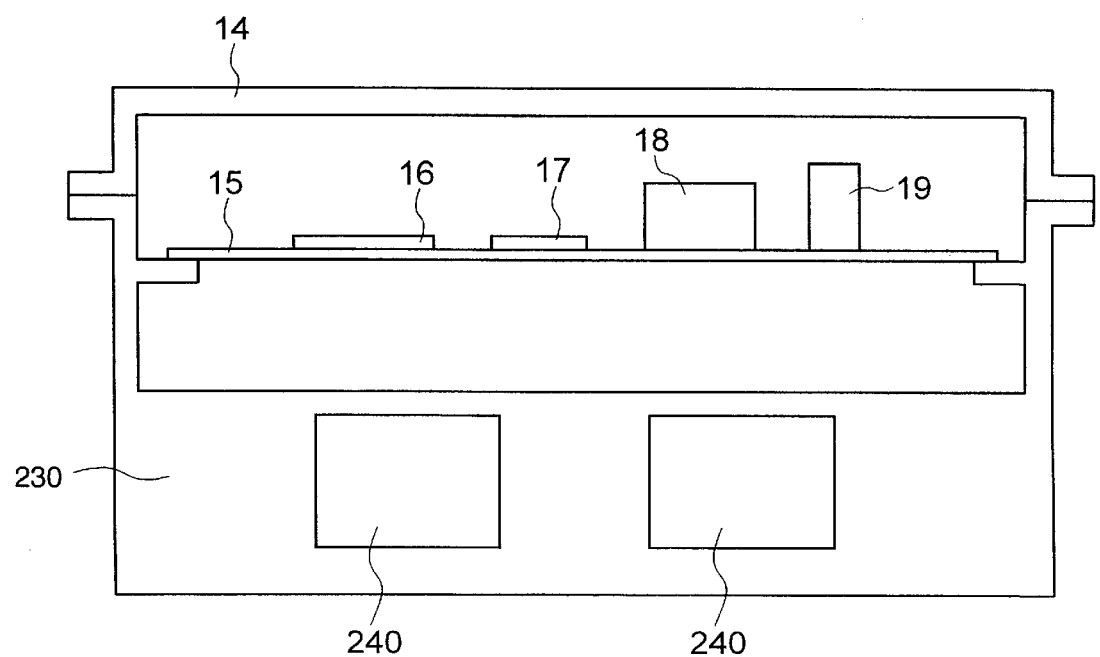
FIG. 24 is a schematic diagram of a sectional structure showing a basic concept of the present invention and shows an area where no power module is mounted.
Figure 25:
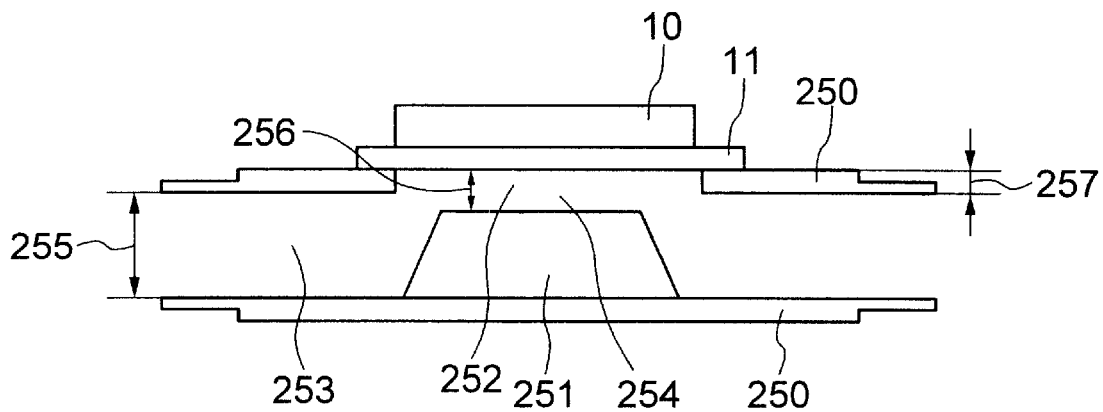
FIG. 25 is a schematic diagram of a section of an inverter with a conventional direct cooling structure.
Figure 26:
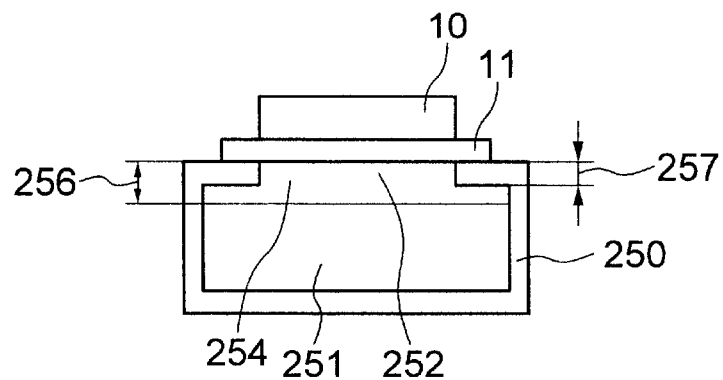
FIG. 26 is a schematic diagram of a section of an inverter with a conventional direct cooling structure.

Finally, FIG. 22 shows a top view after the driver board 58 is mounted. Its parts and mounting section on the housing are omitted. The driver board 58 is connected to the control terminals 189 and 1800 on the top surface in such a way as to cover the aforementioned bus bar by means of through hole solder. The PCB has a thickness of 2 mm and dimensions of 230 mm×180 mm. This plate thickness is determined taking the strength of the PCB into account.

(Embodiment 4)

Figure 8:
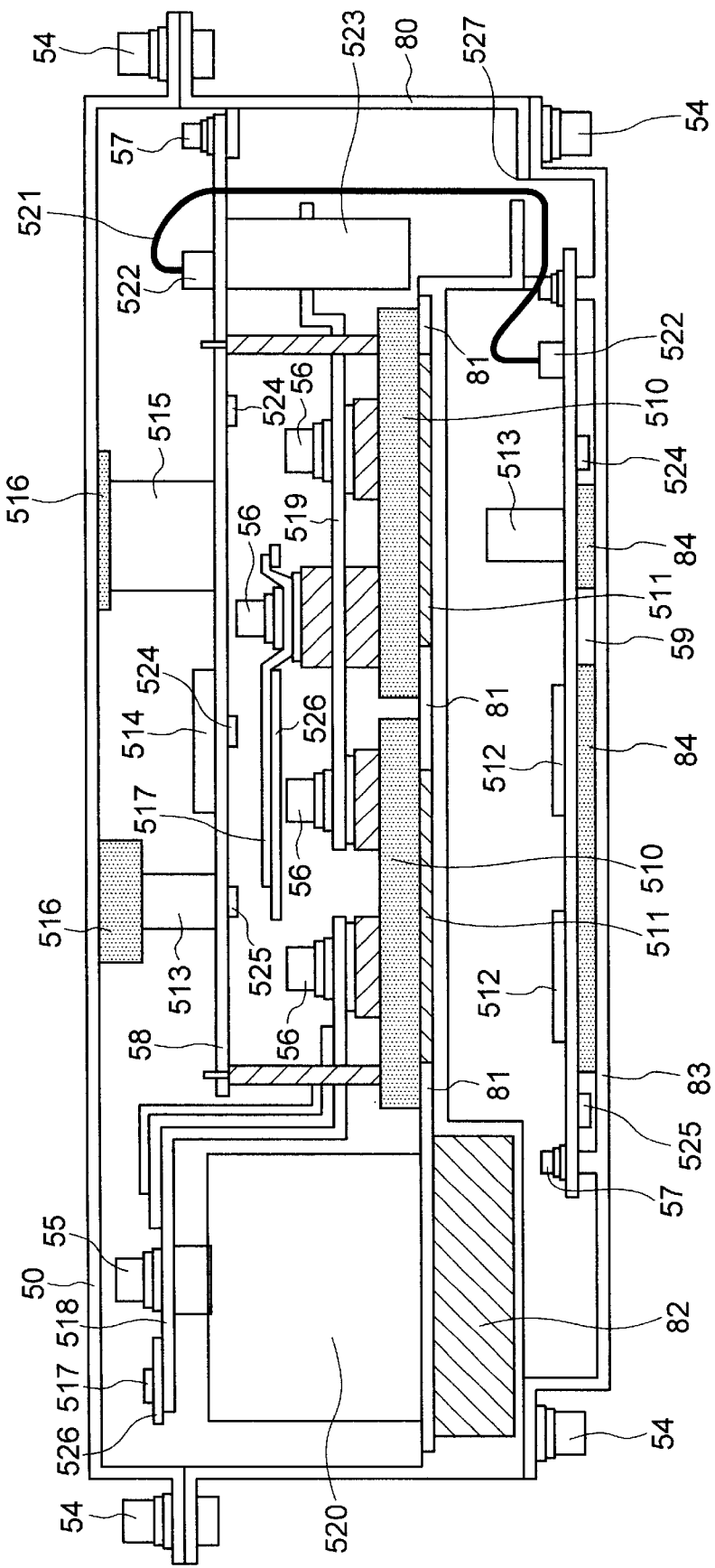
FIG. 8 is a schematic diagram of a sectional structure according to a fourth embodiment.

In the foregoing embodiments, the filter capacitor 520 is cooled by only adhering it to the inverter housing and but such cooling is different from positive cooling. However, from the standpoint of reducing the size of the apparatus, miniaturization of the filter capacitor is important and it is therefore necessary to enhance cooling. This embodiment is intended to realize this. This embodiment will be explained using a schematic diagram of a sectional structure in FIG. 8.

In the foregoing embodiments, cooling water has been used only to positively cool the IGBT modules 510 which are high heating parts. However, devising the water channel also makes it possible to cool other parts. This embodiment provides a water channel 82 for cooling on the under surface of the filter capacitor 520, too.

Heating of the capacitor 520 is small compared to the IGBT module 510. Therefore, the flow velocity of the cooling water needs to be increased not so much as for the water channel 511. Thus, the cross-sectional area of the water channel 82 is regarded to be 5 times as large as the shallow water channel 51 and the flow velocity is reduced to ⅕. The water channel 82 is constructed by changing the shapes of the inverter housing 80 and the aluminum plate with an opening (2 mm thick) 81.

This water channel 82 makes it possible to reduce the temperature of the filter capacitor 520 by 30° C. compared to a case without the water channel. On the other hand, because of small flow velocity, pressure loss hardly increases and has only increased 0.5 kPa compared to Embodiment 1. Since the position of the filter capacitor 520 has shifted upward by a space corresponding to the water channel, the height of the inverter is increased by 10 mm to become 80 mm. The area remains unchanged.

This embodiment also enhances cooling of the control board by adhering thermal conductive sheets 84 under the PCB 59 of the mounting section of the electrolytic capacitor 513 and dissipating heat toward the bottom cover.

The inverter of the present invention has a structure for cooling the IGBT module 510 by allowing cooling water to directly contact the IGBT module 510 as described above. In the case of this structure, it is difficult to completely eliminate the possibility that cooling water will leak into the inverter housing from the interface between the IGBT module and the housing sealed with a gasket. Thus, considerations should be given to electric shock by electric leakage. The following Embodiments 5, 6 and 7 are the ones that address this problem.

(Embodiment 5)

Figure 9:
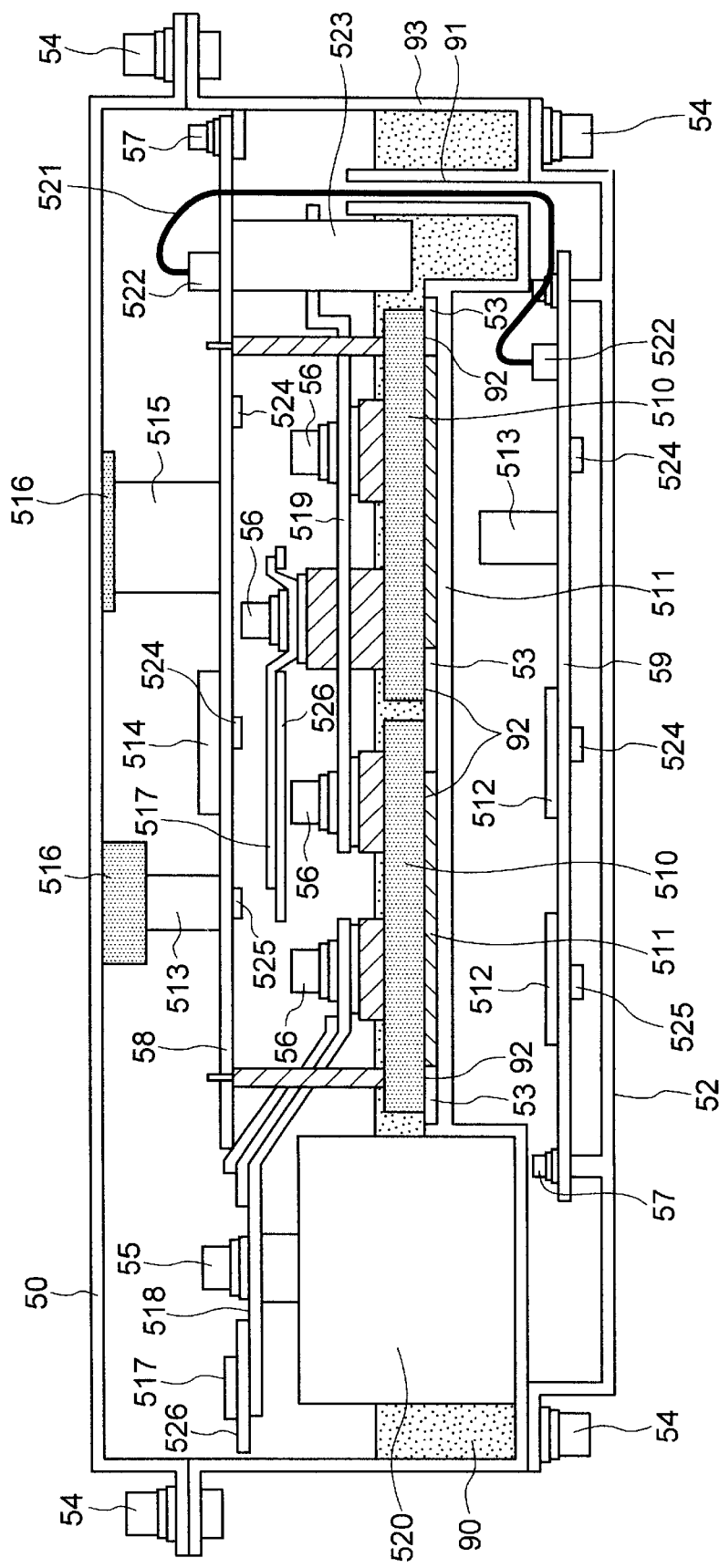
FIG. 9 is a schematic diagram of a sectional structure according to a fifth embodiment.

This embodiment will be explained using a schematic diagram of a sectional structure in FIG. 9. FIG. 9 shows a sectional view of the same section as that in FIG. 5. As described above, the IGBT modules 510 are adhered through a liquid gasket and cooling water sealing performance of a cooling water pressure of up to 200 kPa has been confirmed. This pressure is over 10 times as big as the pressure during normal operation and poses no problem for normal operation.

However, if an abnormal water pressure is applied due to some influences, there is a possibility that water will leak from sections 92 peripheral to the IGBT modules. This embodiment fills the inverter housing 93 with urethane resin 90 to prevent cooling water from entering the housing 93. In this case, an opening 91 for the interface cable 521 has a structure protruding over the top surface of the urethane resin so that the urethane resin 90 does not leak toward the bottom cover. The adhesive property of the interface between the urethane resin 90 and the housing 93 is sufficient and the experiment result confirms that cooling water never passes through this interface.

(Embodiment 6)

Figure 10:
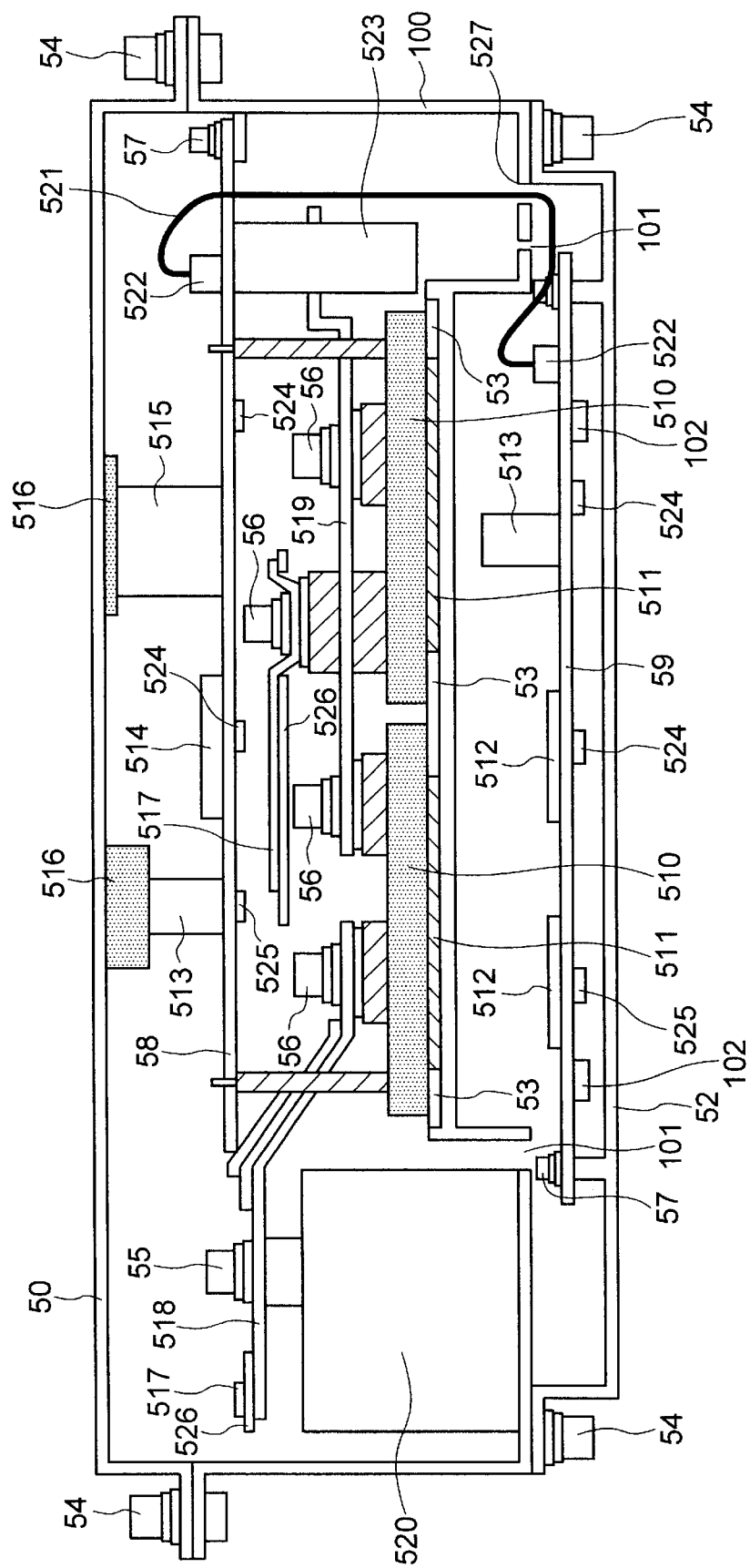
FIG. 10 is a schematic diagram of a sectional structure according to a sixth embodiment.

Another embodiment of measures for water leakage will be explained using FIG. 10. It shows a schematic diagram of a section of the same area as that in FIG. 9. This embodiment is characterized in that since there is no high voltage section, even if some electric leakage occurs, it is escaped to an area where there is no safety problem. This embodiment features an opening 101 to escape leak water to the bottom cover provided on the bottom face of the inverter housing 100.

It is preferable to form as many openings 101 as possible within a range that will not interfere with the water channel.

This embodiment provides six openings of 2 mm wide and 20 mm long. The microcontroller board 59 in the bottom cover 52 operates on a 5 V power supply and signals are also insulated by a photocoupler, which prevents any safety problems should it be electrically charged. The board 59 is provided with a water leakage sensor 102 to input water leakage information to the microcontroller 512 and stop the water cooling pump, thus exercising control to ensure that water leakage does not continue.

(Embodiment 7)

Figure 1:
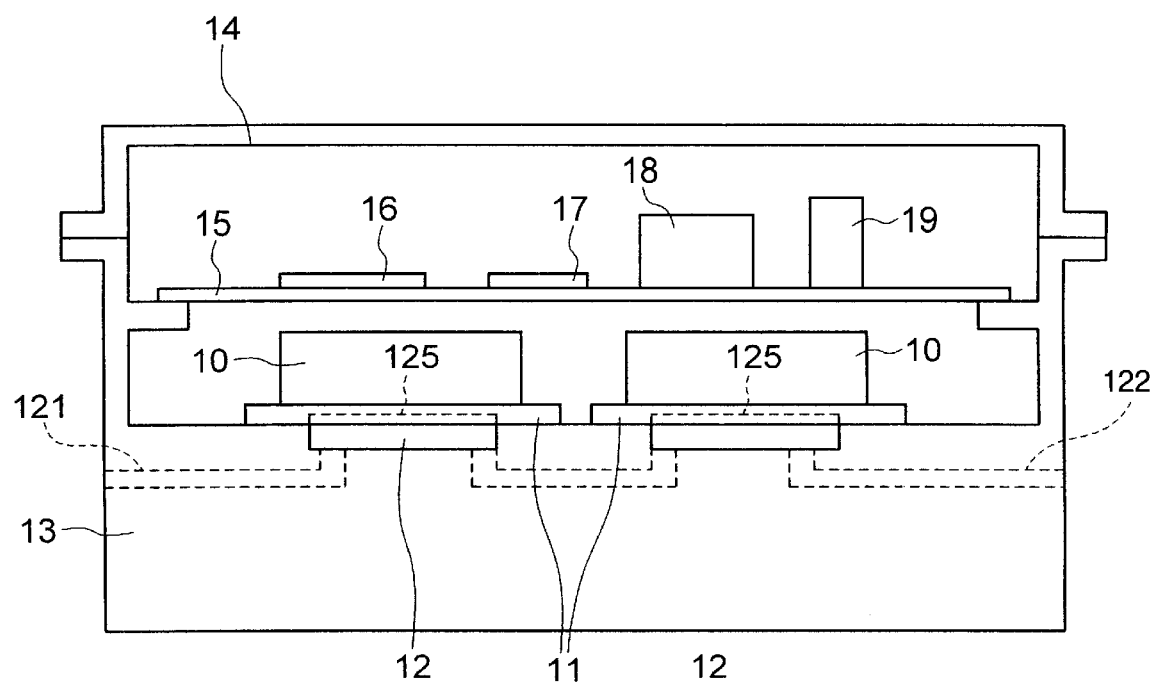
FIG. 1 is a schematic diagram of a sectional structure showing a basic concept of the present invention.
Figure 2:
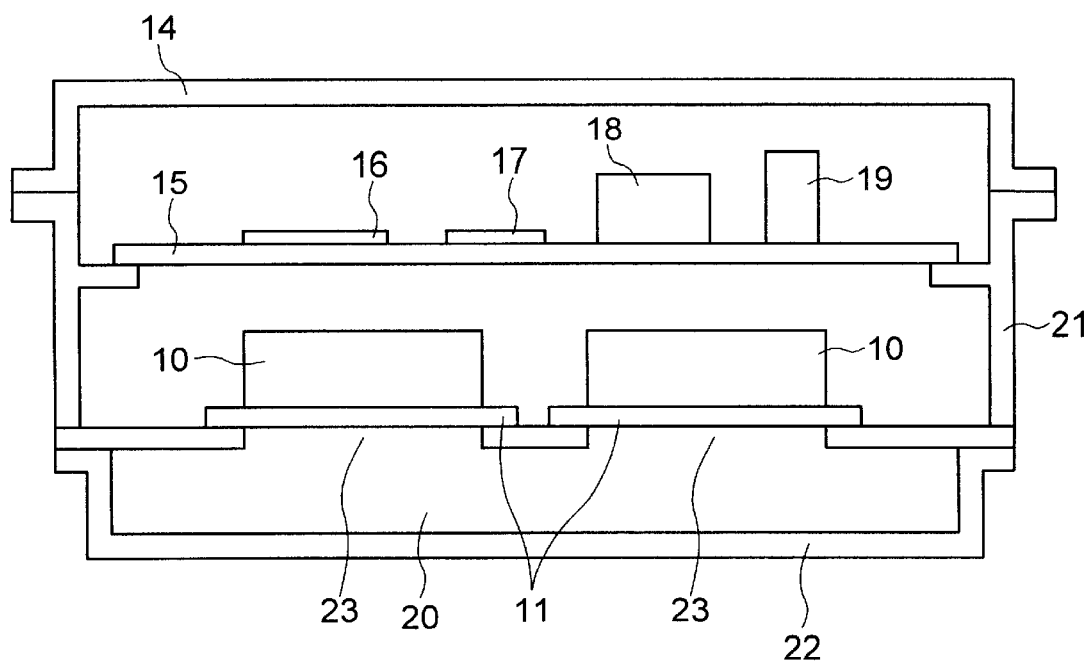
FIG. 2 is a schematic diagram showing a section of an inverter with a conventional direct cooling structure.
Figure 3:
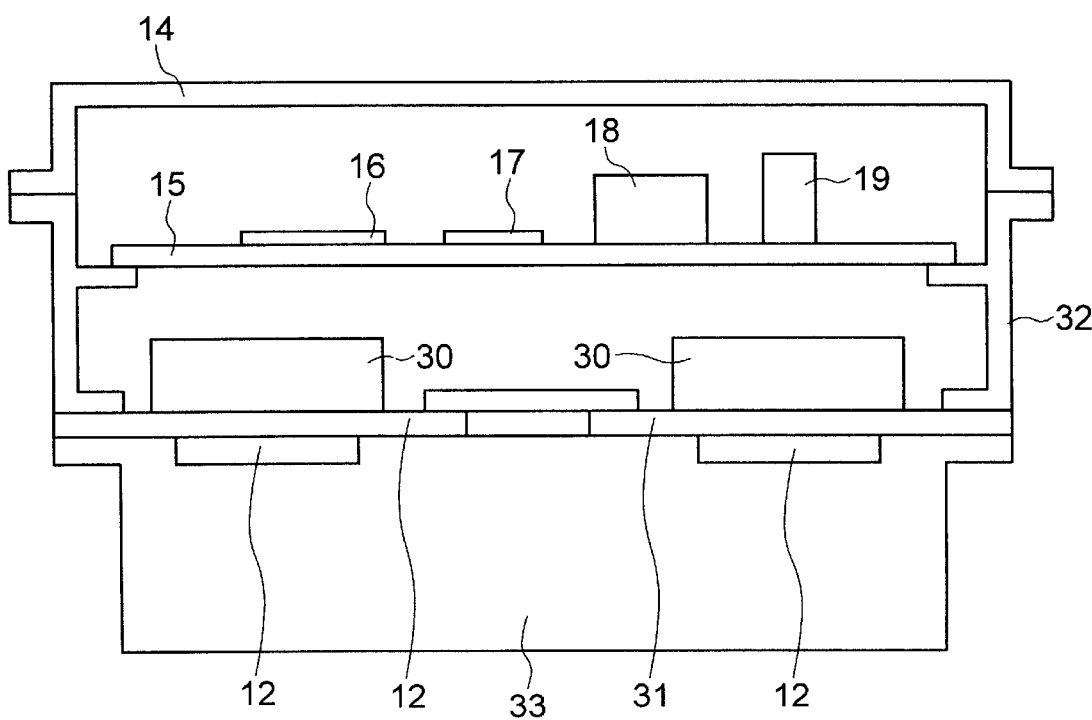
FIG. 3 is a schematic diagram of a sectional structure showing a basic concept of the present invention.
Figure 4:
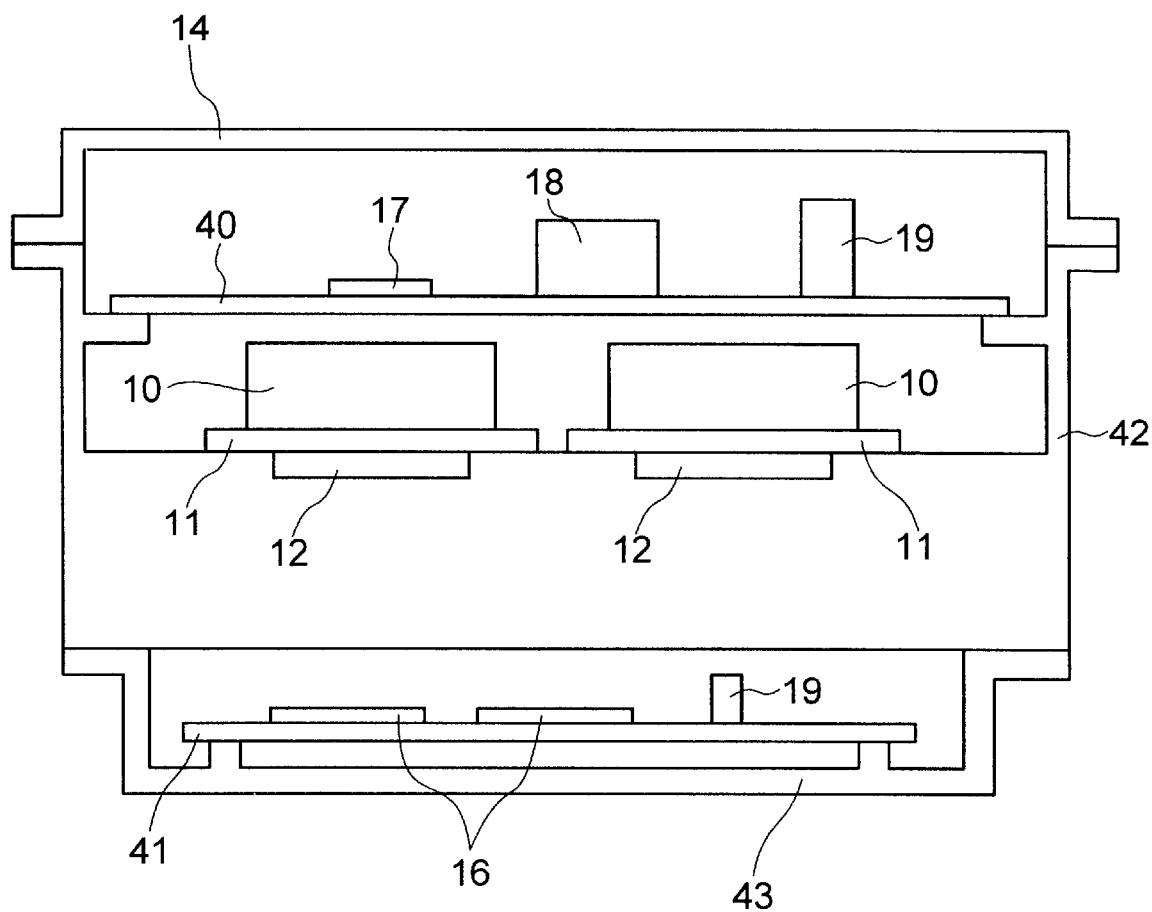
FIG. 4 is a schematic diagram of a sectional structure showing a basic concept of the present invention.

The above-described two embodiments of water leakage measures adopt a structure of preventing leak water from entering the housing by resin or escaping the infiltrating leak water to an area where there is no possibility of electric shock. This embodiment provides drastic measures, in the event of water leakage, to escape cooling water to the outside of the housing. Of the structure in which a deep water channel and a shallow water channel are formed, the schematic diagram of a section of the shallow water channel is shown in FIG. 3.

A housing 32 is connected to the surface of a metallic base 31 on the bottom surface of power modules 30 and the opening on the bottom surface of the housing 32 is blocked by the metallic base 31. Shallow water channels 12 are formed by connecting a water channel bottom cover 33 where a plurality of cavities of different depths is formed to the back of the metallic base 31.

That is, the point of this structure is that the water channel formed by making cavities in the housing is separated from the housing using a dedicated water channel structure. Even if sealing of cooling water is broken and water leaks out of the water channel, this structure prevents leak water from infiltrating into the housing 32, completely eliminating the possibility of electric shock.

The following three embodiments are intended to enhance cooling of the microcontroller board in the bottom cover.

(Embodiment 8)

Figure 12:
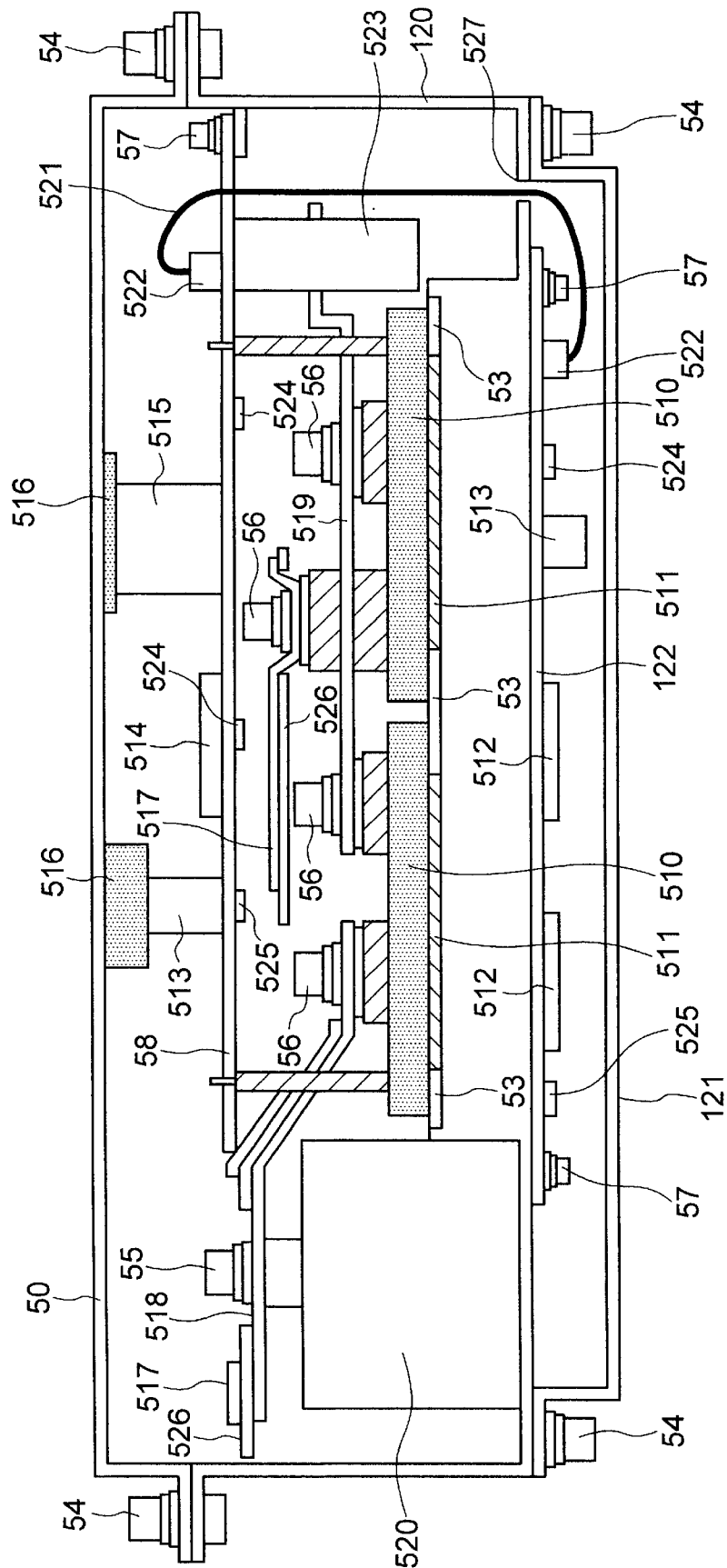
FIG. 12 is a schematic diagram of a sectional structure according to an eighth embodiment.

This embodiment will be explained using the schematic diagram of a sectional structure shown in FIG. 12. M3 bolt screw holes are perforated in the bottom face of an inverter housing 120 and a PCB 122, a microcontroller board, is fixed with M3 bolts 57. That is, the entire back surface of the PCB 122 contacts the bottom face of the water channel 511.

Thus, unlike the embodiments so far, despite the defect that both sides of the PCB cannot be mounted, this embodiment allows drastic improvement of heat dissipation performance and attains drastic reduction of temperature of the microcontroller board. Moreover, further reduction of temperature is attainable by adopting a layout placing the microcontroller 512 closer to the water channel.

(Embodiment 9)

This embodiment has the same concept as that of Embodiment 8. In the case of Embodiment 8, it is preferable that the bottom face of the housing 120 be flat from the standpoint of mounting the PCB 122. Therefore, the housing is manufactured using aluminum die casting, etc.

Figure 13:
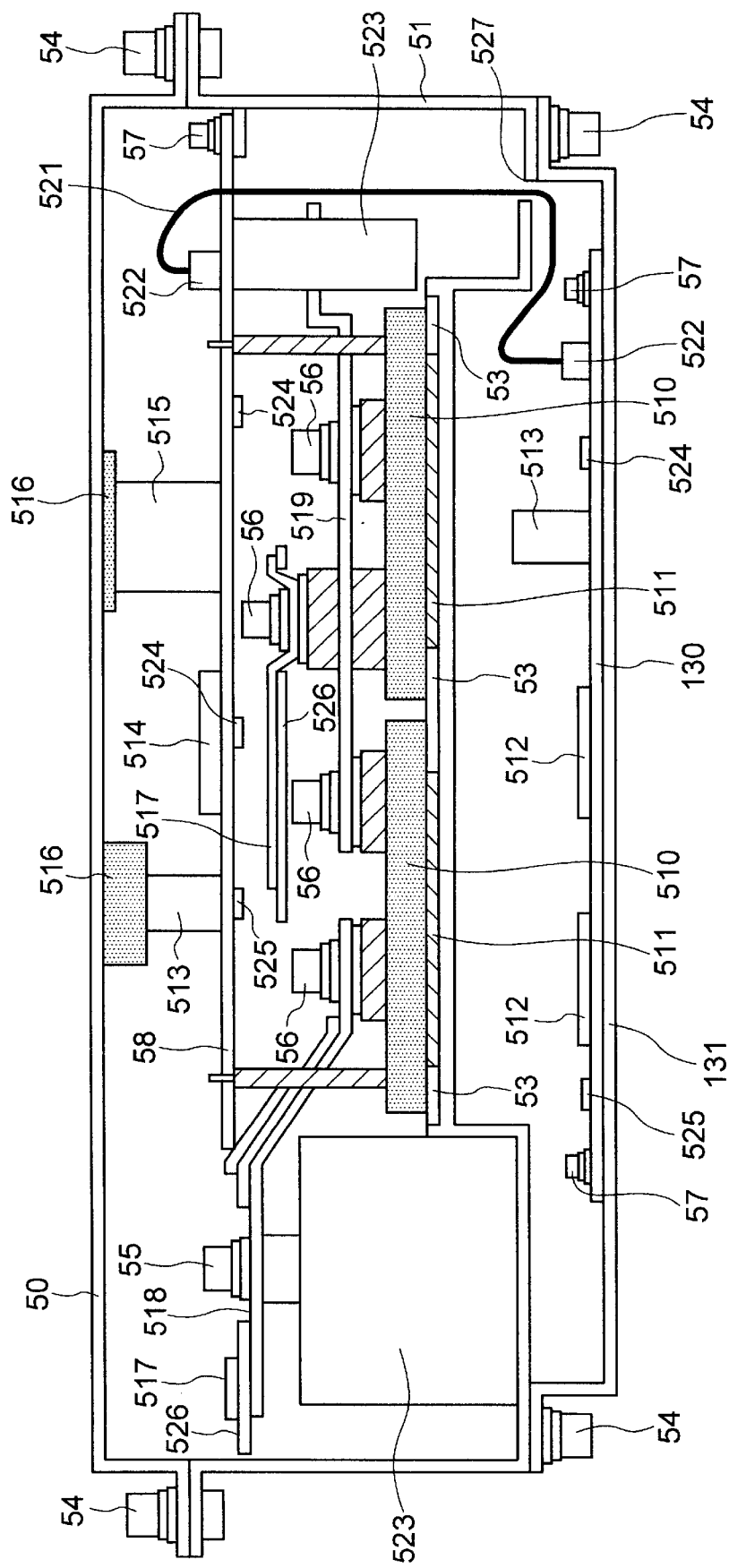
FIG. 13 is a schematic diagram of a sectional structure according to a ninth embodiment.

In the case where the housing has a simple shape and can be manufactured even using press working, etc., based on the concept of the present invention, there are cavities of different depths in the housing, and therefore there are projections and depressions on the bottom face of the housing. That is, it is difficult to paste the microcontroller board to the bottom face of the housing. FIG. 13 shows a schematic diagram of a sectional structure of the embodiment which addresses this problem.

High heat dissipation is realized by pasting the entire back side of the PCB 130 to the bottom cover 131 using M3 bolts 57. The PCB has the same defect of resulting in one-side mounting as in the case of Embodiment 8 and the cooling efficiency is slightly lower than Embodiment 8. However, since the microcontroller board 130 is mounted on the bottom cover 131 beforehand and assembled into the housing 51 together with the bottom cover as in the case of Embodiment 3, which provides excellent assembly performance.

(Embodiment 10)

Figure 14:
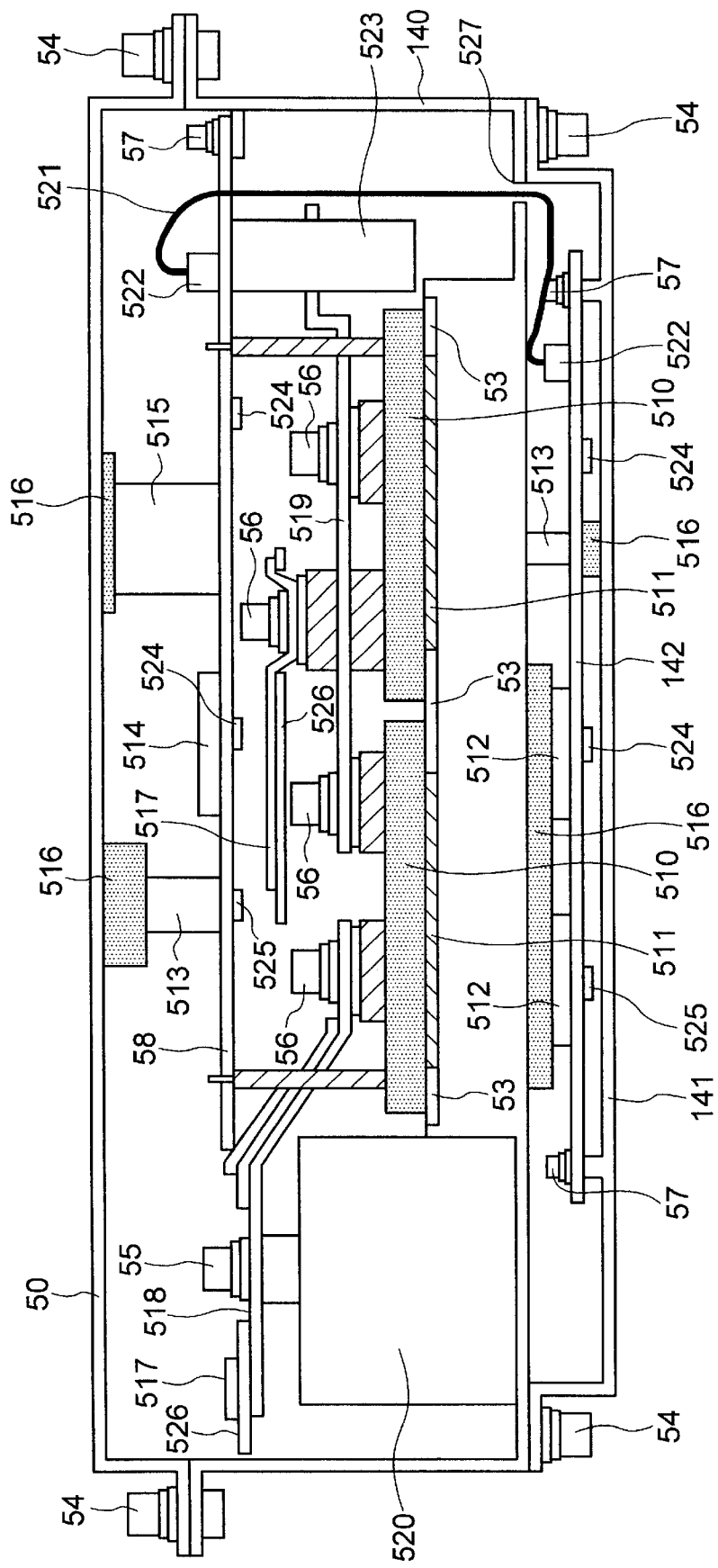
FIG. 14 is a schematic diagram of a sectional structure according to a tenth embodiment.

This is an embodiment having a feature intermediate between Embodiments 8 and 9. This embodiment will be explained using FIG. 14, which is a schematic diagram of a sectional structure.

In view of high-density mounting of a PCB, double-side mounting is still necessary. Thus, this embodiment applies double-side mounting to the PCB 142, dissipates heat of the microcontroller 512 toward the housing 140 by making the surface of the microcontroller package contact the thermal conductive sheet 516 which is adhered to the bottom face of the housing 140 beforehand and dissipates heat of the electrolytic capacitor 513 toward the bottom cover through the thermal conductive sheet 516 of the back of the PCB in the mounting section. That is, this embodiment is an example where consideration is given to high heat dissipation for the microcontroller while taking assembly performance into account.

(Embodiment 11)

Figure 28:
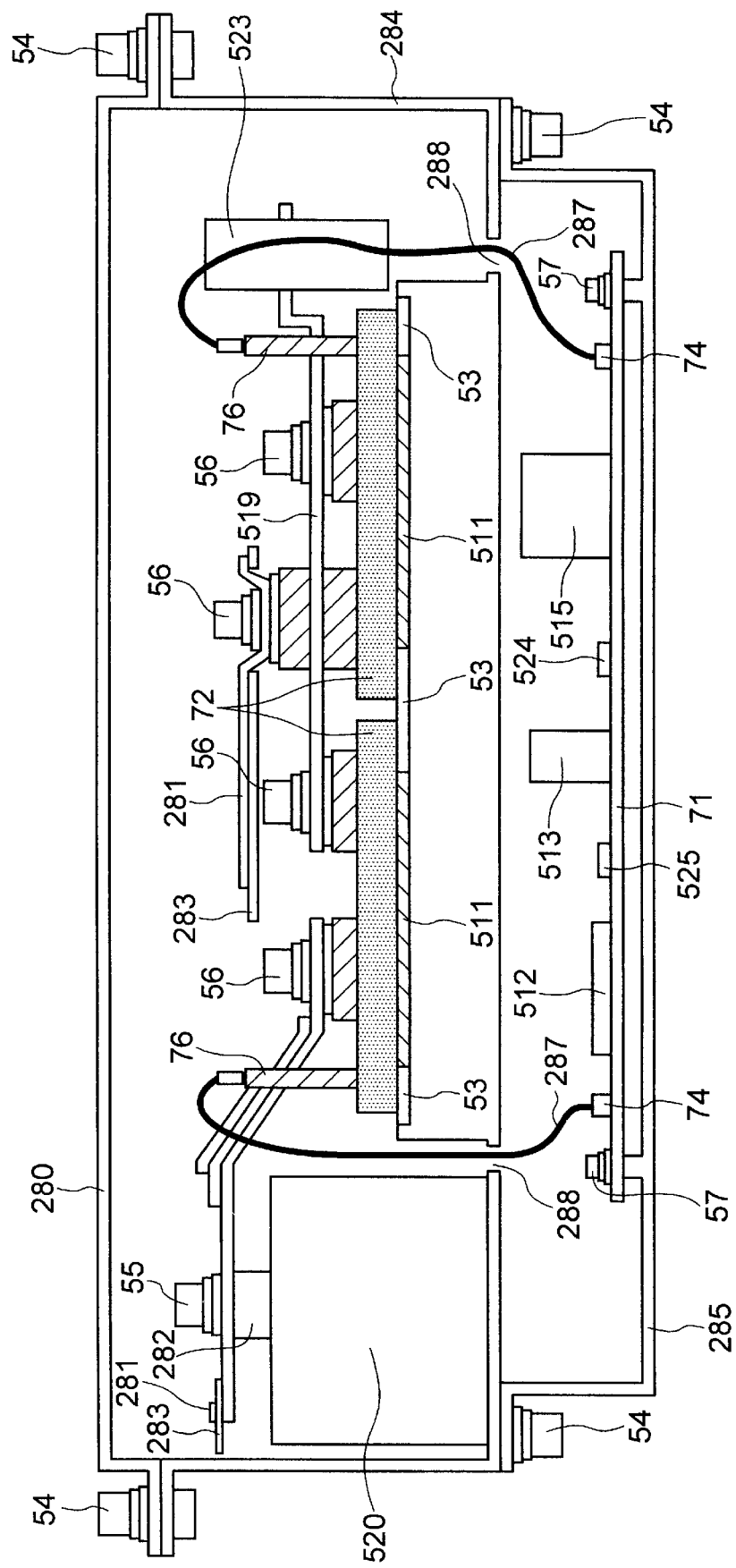
FIG. 28 is a schematic diagram of a sectional structure according to the tenth embodiment.

An eleventh embodiment will be explained using a schematic diagram of a sectional structure in FIG. 28. This embodiment is an embodiment where the control circuit board is placed only in the bottom cover 285 instead of placing it in the inverter housing 284.

This is equivalent to a case where the control circuit board in Embodiment 2 shown in FIG. 7 is moved from the top cover to the bottom cover. Therefore, the structure of the IGBT module 72 incorporating a gate driver and the structure of the control board 71 are the same as Embodiment 2. Its object is to provide a structure with no need to consider reduction of temperature of the control circuit board.

A control board 71 is fixed to the bottom cover 285 using M3 bolts 57 and the control board 71 is connected to the IGBT modules 72 incorporating a gate driver via interface cables 287 passing through two openings 288 provided on the bottom face of the housing 284.

Since the control signal is a driver drive signal as in the case of Embodiment 2, use of a long cable has no noise-related problem. The driver incorporated in the module is cooled by a cooling water channel 511, and therefore there is no temperature-related problem and since the board 71 is thermally cut off from the inside of the housing 284, this is the most effective embodiment in the aspect of reduction of temperature of the control circuit. Since no control circuit exists in the top cover 280, this embodiment has a shallower structure than the foregoing embodiments.

(Embodiment 12)

Figure 11:
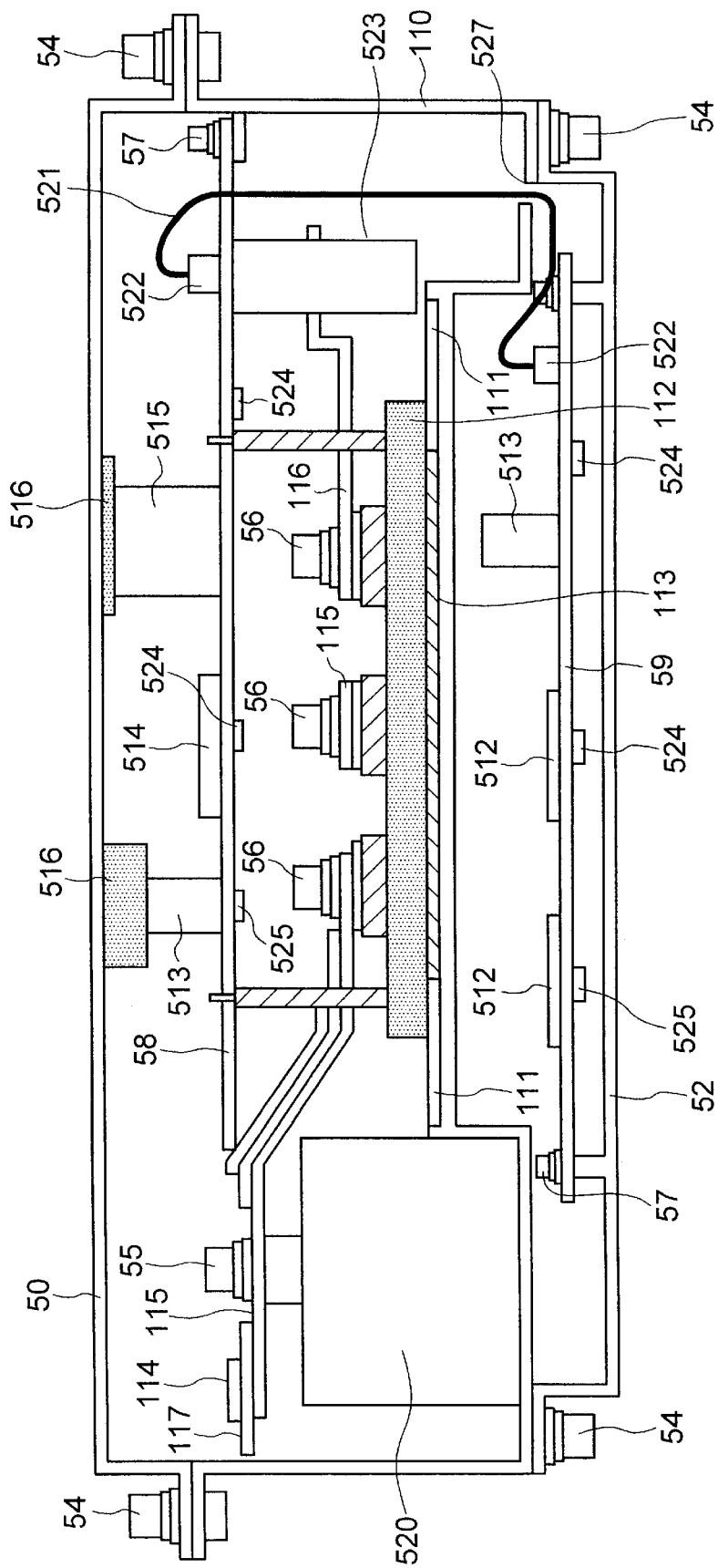
FIG. 11 is a schematic diagram of a sectional structure according to an eleventh embodiment.

A twelfth embodiment will be explained using a schematic diagram of a sectional structure in FIG. 11.

All the foregoing embodiments describe the case where the IGBT module is provided with one arm. In this case, because of the small size of the module, there are advantages such as small latent stress inside the module and high manufacturing yield, etc. However, the number of shallow and deep water channels connecting six modules increases, which makes the shape of the water channels complicated.

This embodiment describes a case addressing this problem. Embodiment 3 in FIG. 5 is characterized in that the IGBT module 112 constitutes a single-phase module and the shallow water channel 113 is twice as wide as the conventional water channel. The shallow water channel has a depth of 2 mm and changes the structure of the water channel by changing the shape of the opening of the aluminum plate 111 of 2 mm in thickness and the shape of only the deep cavity (not shown) in the housing 110.

As the mode of the IGBT module changes, P and N bus bars 115 and 114, an insulating plate 117, U, V and W output wires 116 change from those in the case in FIG. 5. Since the water channel is about twice as wide as the case in FIG. 5, the flow rate becomes twice to maintain the same cooling performance, but the number of water channels connected in series decreases and therefore pressure loss can be reduced by half.

(Embodiment 13)

Figure 15:
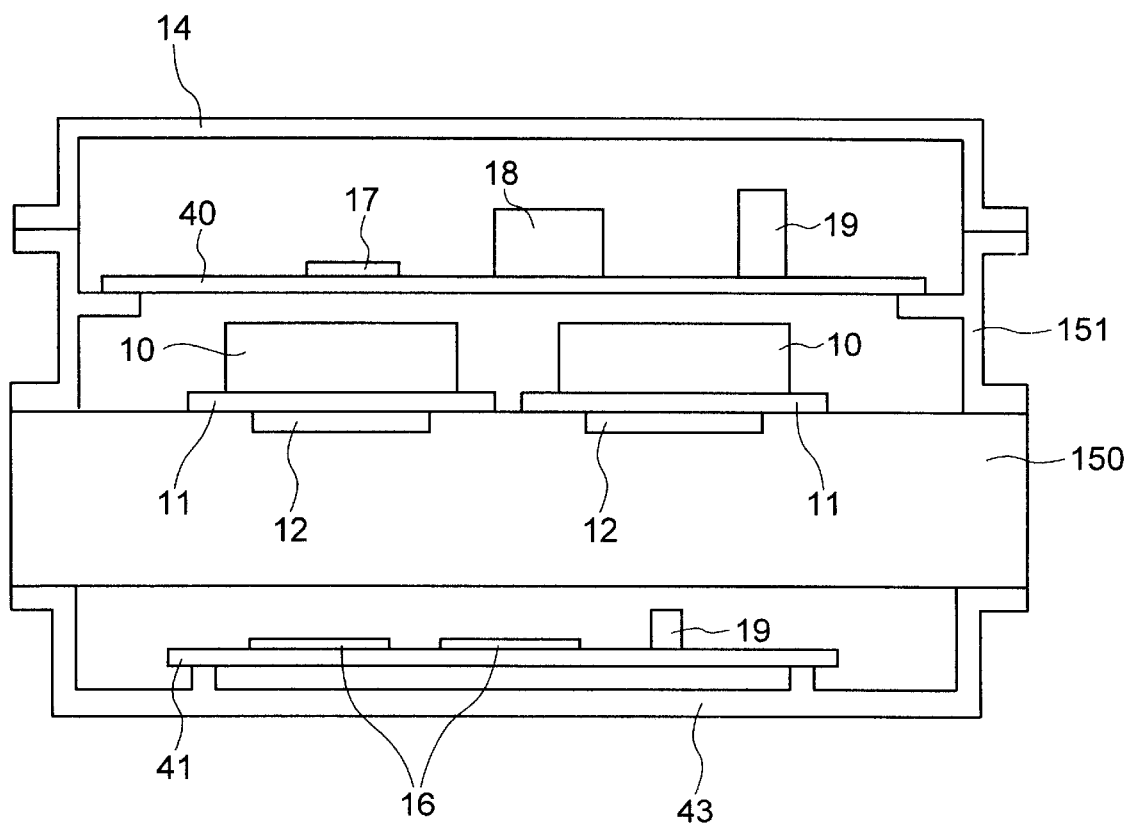
FIG. 15 is a schematic diagram of a sectional structure according to a thirteenth embodiment.

A thirteenth embodiment will be explained using FIGS. 15 and 16. These drawings are sectional views showing the concept of this embodiment. For example, electric vehicles require various motors with different capacities to drive vehicles with various kinds of performance.

Furthermore, even with a same vehicle, the motor for driving has capacity different from that of the motor for power generation. Driving these different motors requires various inverters with different capacities. If it is possible manufacture inverters with various capacities using a simple method, this will have effects on the spread of inverters and therefore the spread of electric vehicles. This embodiment shows an example of attaining this object.

An inverter control method, a driver circuit to control driving of power semiconductor devices and various protection circuits, etc. often vary from one inverter to another. On the other hand, a power module, which is a motor current drive circuit, and its cooling system only have variations in the capacity of the power module and can be shared by different inverter apparatuses.

This embodiment shows a method of achieving commonality of a power circuit. In FIG. 15, a power semiconductor module 10 is fixed to a water channel structure 150 in which cavities of different depths are formed to form a shallow water channel 12 in the same way as for the foregoing embodiments. The water channel structure 150 does not form one body with the inverter housing and is independent of the inverter housing unlike the foregoing embodiments.

The inverter housing is constructed of the water channel structure 150 and a side wall 151. The configurations and method of connection of a gate driver board 40 fixed to the side wall 151 and a microcontroller board 41 in the bottom cover 43 are the same as those in the foregoing embodiments. This embodiment intends to expand the capacity of this structure by achieving commonality between the water channel structure 150 and power module 10.

Figure 16:
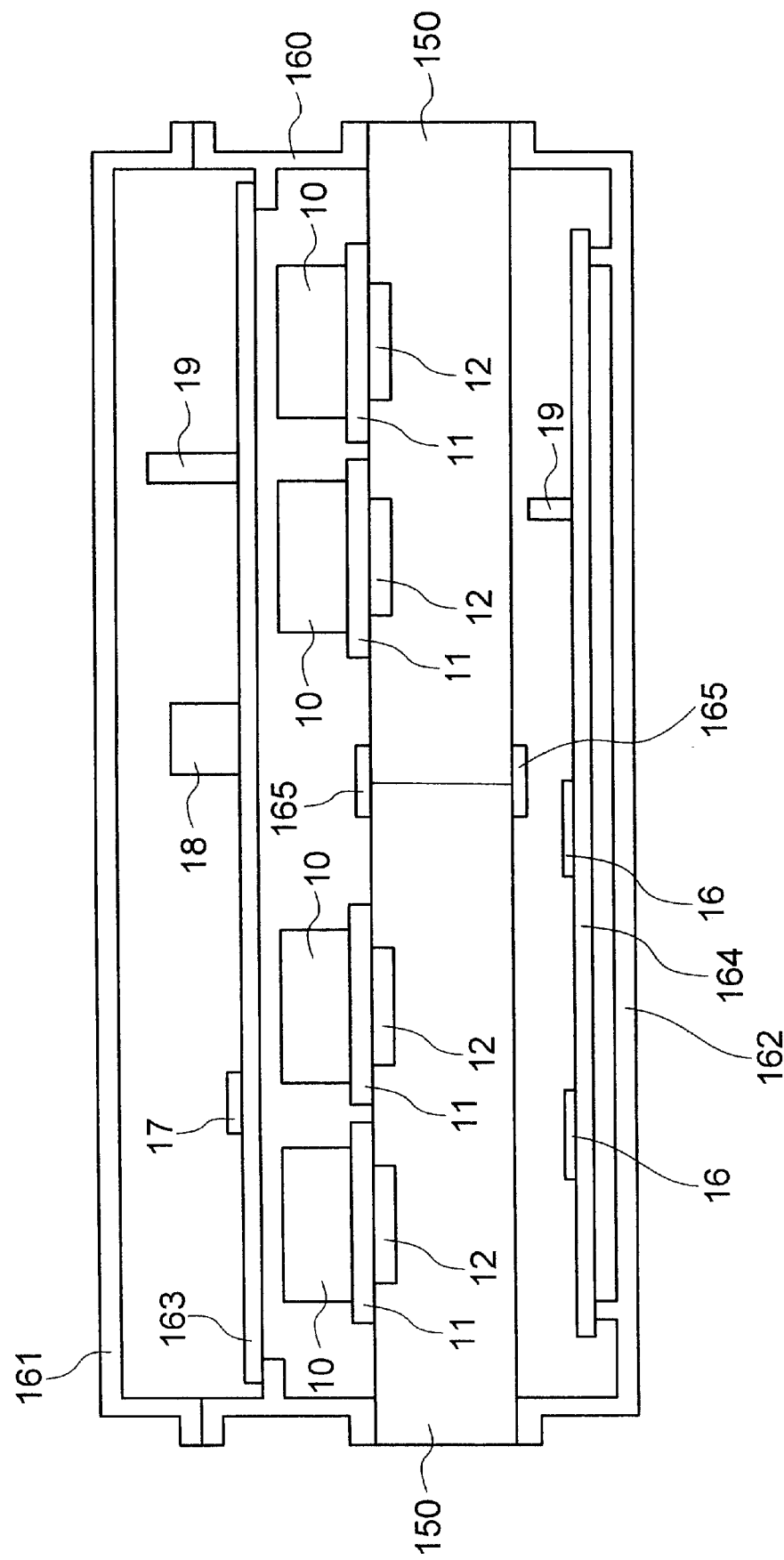
FIG. 16 is a schematic diagram of a sectional structure according to the thirteenth embodiment showing an example of a capacity expansion of FIG. 15.

FIG. 16 shows its structural schematic diagram. This is an embodiment where two structures 150 are placed side by side and the current capacity is doubled. The structures 150 are connected by a water channel structure connecting board 165 into one body, fixed to the side wall 160 and the bottom face is covered with a bottom cover 162. In this structure, though the common water channel structures 150 are placed side by side, they work together as one inverter.

It is likely to achieve commonality between the microcontroller board 164 and the microcontroller board 41 unless its control function is changed. It is selectable whether the cooling water in the water channel structures 150 connected in parallel should be let out in series or in parallel depending on the water cooling performance required.

This is an embodiment of the method of expanding the capacity of the power circuit including the cooling water system. The point is to expand the capacity by constructing the housing with the side wall, the power circuit and the bottom plate constituting the water channel and connecting the common bottom plate.

(Embodiment 14)

Figure 27:
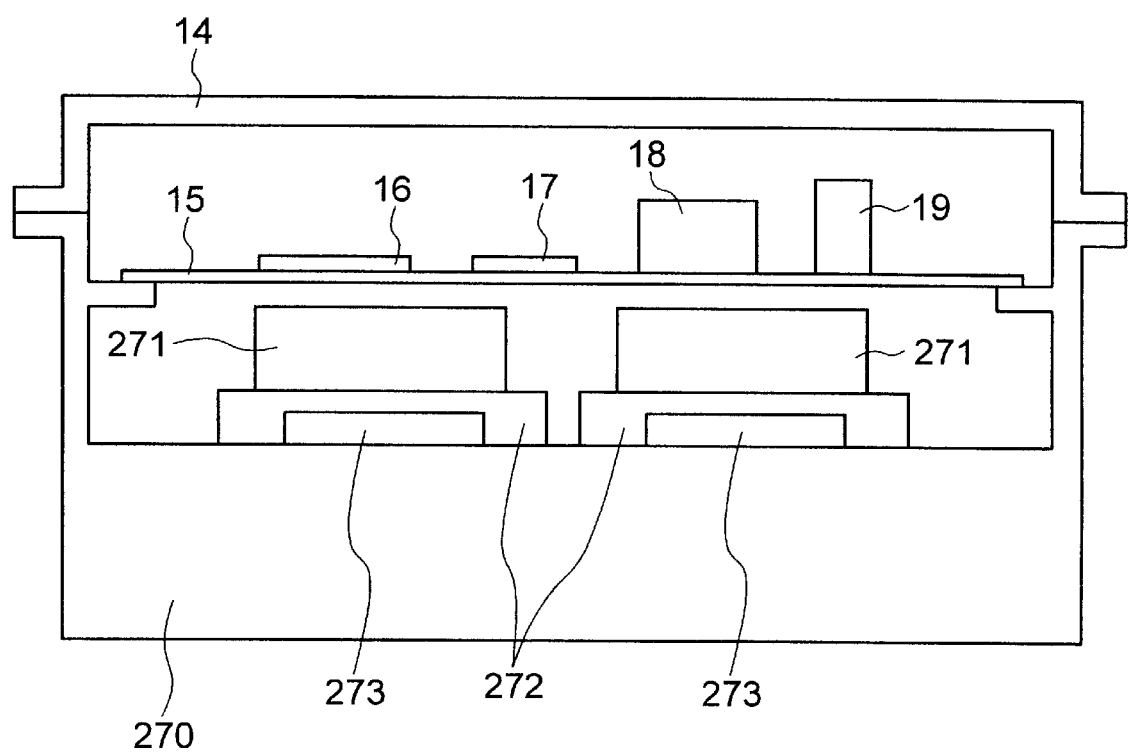
FIG. 27 is a schematic diagram of a sectional structure according to a fourteenth embodiment.

A fourteenth embodiment will be explained using FIG. 27. This shows a schematic diagram of a sectional structure of a shallow water channel for cooling a power module.

Cavities for water channels are provided in the inverter housing or dedicated water channel cover in the foregoing embodiments, but this embodiment describes a case where cavities for a shallow water channel are provided on a metallic base of a power module. Cavities 273 of 2 mm in depth are formed on the bottom face of the metallic base 272 of the power module 271 and are adhered to the inner bottom face of the inverter housing 270 using a liquid gasket.

Though this sectional view does not show any cavity in the inverter housing 270, a cavity as deep as 15 mm is formed in the housing 270, connected to the shallow cavities 273 to connect the entire water channel. This structure makes it possible to achieve thermal resistance, Rth(j–w) and pressure loss equivalent to those in Embodiment 1.

If, for example, the depth of a shallow water channel for cooling the power module is reduced to as small as 1 mm or less, press working is an excellent method to form the shallow water channel accurately, and this embodiment has a merit in providing a module base normally made of copper to make it easier to apply press working.

The method of improving the cooling performance of the power circuit and control circuit constituting an inverter has been explained so far and it has been made clear that temperatures of both circuits can be reduced drastically. In the case of, for example, a so-called hybrid car, which is driven by a motor and engine, the cooling system consists of an engine and motor/inverter, which are independent of each other so far. On the other hand, the present invention has an effect of cooling the engine and motor/inverter using a common system. Or it is also possible to apply a common cooling system for the engine and inverter and a different system to the motor.

According to the present invention, the water channel for cooling the power semiconductor module is constructed of a plurality of shallow cavities and deep cavities in the housing and the power semiconductor module is cooled with the shallow water channel using the shallow cavities. This has the effects of increasing the flow velocity of the cooling water in the cooling section, improving the cooling efficiency and reducing pressure loss as well. Furthermore, the use of a plurality of cavities makes it possible to place a plurality of power semiconductor modules according to the configuration of the apparatus, thus improving yield and reliability of the power semiconductor modules and the entire apparatus.

Furthermore, placing control circuit boards above and below the water channels and power semiconductor modules, placing boards requiring more temperature reduction below the water channels and power semiconductor modules to thermally cut them off have the effects of drastically reducing temperatures of the control circuit and improving the reliability of the apparatus.

Furthermore, using a water channel structure that constitutes a side wall and bottom face as a housing, uniting the power semiconductor modules and the water channel structures for cooling to achieve commonality, connecting these water channel structures into one body when expanding the capacity of the inverter and uniting them using the side wall and bottom cover, which are independent components, will have the effects of improving the assembly efficiency and yield of multi-type inverters.

It should be further understood by those skilled in the art that the foregoing description has been made on embodiments of the invention and that various changes and modifications may be made in the invention without departing from the spirit of the invention and the scope of the appended claims.

What is claimed is:

1. A water cooled inverter comprising:
    a water channel in which cooling water flows; and
    a power circuit device on which a power semiconductor chip is mounted, the power circuit device being provided with a metallic body on its bottom surface, wherein
        a portion of said water channel for cooling said power circuit device is defined by a bottom surface of said metallic body and a part of a container accommodating said power circuit device,
        said cooling water directly contacts said metallic body, and
        the depth of said portion of said water channel for cooling said power circuit device is determined by the depth of a cavity provided in the part of said container and/or the depth of a cavity of the bottom surface of said metallic body.

2. The water cooled inverter according to claim 1, wherein
    said water channel in which the cooling water flows has different depths,
    said portion of the said water channel has the shallowest depth, and
    another portion of said water channel has a depth that is greater than the shallowest depth and is determined by the depth of a cavity formed in another part of said housing.

3. The water cooled inverter according to claim 2, wherein the shallowest depth of the water channel for cooling said power circuit device is 5 mm or less.

4. The water cooled inverter according to claim 2, wherein
    a control circuit board for controlling said power circuit device is placed above the power circuit device having said power semiconductor chip, and
    a circuit device mounted on said control circuit board is connected to a top cover covering the control circuit board via a heat conductive resin sheet.

5. The water cooled inverter according to claim 1, wherein
    a control circuit board for controlling said power circuit device is placed below the power circuit device having said power semiconductor chip and the water channel.

6. The water cooled inverter according to claim 5, wherein
    the power circuit device connected to and controlled by said control circuit board comprises said power semiconductor chip and the a control circuit for controlling said power semiconductor chip which are housed in a common resin box.

7. The water cooled inverter according to claim 1, wherein
    a control circuit board for controlling said power circuit device is placed above the power circuit device having said power semiconductor chip, and
    a circuit device mounted on said control circuit board is connected to a top cover covering the control circuit board via a heat conductive resin sheet.

8. The water cooled inverter according to claim 2, wherein
    a control circuit board for controlling said power circuit device is placed below the power circuit device having said power semiconductor chip and the water channel.

9. The water cooled inverter according to claim 8, wherein
    the power circuit device connected to and controlled by said control circuit board comprises said power semiconductor chip and a control circuit for controlling said power semiconductor chip which are housed in a common resin box.

10. A water cooled inverter comprising:
    a water channel in which cooling water flows;
    a power circuit device on which a power semiconductor chip is mounted, the power circuit device being provided with a metallic body on its bottom surface; and
    a control circuit board for controlling said power circuit device, wherein
        a portion of said water channel for cooling said power circuit device is defined by a bottom surface of said metallic body and a part of the housing of said power circuit device,
        said cooling water directly contacts said metallic body, and
        there are at least two control circuit boards for controlling said power circuit device, which are provided above and below said power circuit device and the portion of said water channel for cooling said power circuit device, respectively.

11. The water cooled inverter according to claim 10, wherein
    said water channel allowing the cooling water to flow has different depths,
    said portion of the said water channel has the shallowest depth, and
    another portion of said water channel has a depth that is greater than the shallowest depth and is determined by the depth of a cavity formed in another part of said housing.

12. A water cooled inverter comprising:
    a water channel in which cooling water flows;
    a power circuit device on which a power semiconductor chip is mounted, the power circuit device being provided with a metallic body on its bottom surface;
    at least two control circuit boards for controlling said power circuit device; and
    a top cover and bottom cover for covering the top and bottom of the inverter, respectively, wherein
        a housing of said power circuit device comprises a container constituting a water channel connected to the bottom surface of said power circuit device so that the cooling water directly contacts said bottom surface of said power circuit device, and a side wall surrounding said power circuit device, and at least one of said control circuit boards is housed in the bottom cover.

* * * * *